United States Patent
Jo et al.

(10) Patent No.: US 10,630,247 B2
(45) Date of Patent: *Apr. 21, 2020

(54) ADAPTIVE MULTIBAND POWER AMPLIFIER APPARATUS

(71) Applicant: SAMSUNG ELECTRO-MECHANICS CO., LTD., Suwon-si (KR)

(72) Inventors: Byeong Hak Jo, Suwon-si (KR); Jong Ok Ha, Suwon-si (KR); Jeong Hoon Kim, Suwon-si (KR); Youn Suk Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/406,199

(22) Filed: May 8, 2019

(65) Prior Publication Data

US 2019/0267950 A1    Aug. 29, 2019

Related U.S. Application Data

(63) Continuation of application No. 15/719,843, filed on Sep. 29, 2017, now Pat. No. 10,374,557.

(30) Foreign Application Priority Data

Oct. 28, 2016 (KR) .......................... 10-2016-0141913
Nov. 23, 2016 (KR) .......................... 10-2016-0156628
Jun. 7, 2017 (KR) .......................... 10-2017-0070923

(51) Int. Cl.
*H03F 1/32* (2006.01)
*H03F 1/02* (2006.01)
(Continued)

(52) U.S. Cl.
CPC ............. *H03F 1/32* (2013.01); *H03F 1/0216* (2013.01); *H03F 1/0222* (2013.01); *H03F 1/302* (2013.01);
(Continued)

(58) Field of Classification Search
USPC .................................. 330/285, 296, 289, 136
See application file for complete search history.

(56) References Cited

U.S. PATENT DOCUMENTS 6,427,067 B1    7/2002 Arentz
7,567,123 B2    7/2009 Leung et al.
(Continued)

FOREIGN PATENT DOCUMENTS

JP    2001-24455 A    1/2001
JP    2009-284174 A    12/2009
(Continued)

OTHER PUBLICATIONS

Korean Office Action dated May 11, 2018 in corresponding Korean Application No. 10-2017-0070923 (5 pages in English, 3 pages in Korean).
(Continued)

*Primary Examiner* — Hieu P Nguyen
(74) *Attorney, Agent, or Firm* — NSIP Law

(57) ABSTRACT

A power amplifier apparatus, includes an envelope tracking (ET) current bias circuit configured to generate a first ET bias current by calculating a direct current DC, based on a reference voltage, and an ET current, based on an ET voltage, according to an envelope of an input signal; and a power amplifier circuit having a bipolar junction transistor supplied with the first ET bias current and a power voltage to amplify the input signal, wherein an average current of the first ET bias current is controlled to be substantially constant.

30 Claims, 19 Drawing Sheets

(51) Int. Cl.
*H03F 3/19* (2006.01)
*H03F 1/30* (2006.01)
*H03F 3/24* (2006.01)
*H03F 3/21* (2006.01)

(52) U.S. Cl.
CPC .............. *H03F 3/19* (2013.01); *H03F 3/21* (2013.01); *H03F 3/245* (2013.01); *H03F 2200/102* (2013.01); *H03F 2200/105* (2013.01); *H03F 2200/111* (2013.01); *H03F 2200/18* (2013.01); *H03F 2200/21* (2013.01); *H03F 2200/451* (2013.01); *H03F 2200/555* (2013.01)

(56) References Cited

U.S. PATENT DOCUMENTS

| | | | |
|---|---|---|---|
| 8,587,377 | B2 | 11/2013 | Khesbak et al. |
| 9,118,281 | B2 | 8/2015 | Hershberger et al. |
| 9,331,653 | B2 | 5/2016 | Khesbak et al. |
| 9,503,026 | B2 | 11/2016 | Lam et al. |
| 9,559,637 | B2 | 1/2017 | Yang et al. |
| 2010/0127781 | A1 | 5/2010 | Inamori et al. |
| 2012/0146734 | A1 | 6/2012 | Khesbak et al. |
| 2013/0328626 | A1 | 12/2013 | Shibuya et al. |
| 2014/0184334 | A1 | 7/2014 | Nobbe et al. |
| 2016/0126901 | A1 | 5/2016 | Knopik |

FOREIGN PATENT DOCUMENTS

| | | |
|---|---|---|
| JP | 2010-124433 A | 6/2010 |
| JP | 2012-186564 A | 9/2012 |
| KR | 10-2015-0131185 A | 11/2015 |
| WO | WO 2014/150273 A1 | 9/2014 |

OTHER PUBLICATIONS

Japanese Office Action dated Jan. 8, 2019 in corresponding Japanese Patent Application No. 2017-200648 (7 pages in English, 3 pages in Japanese).

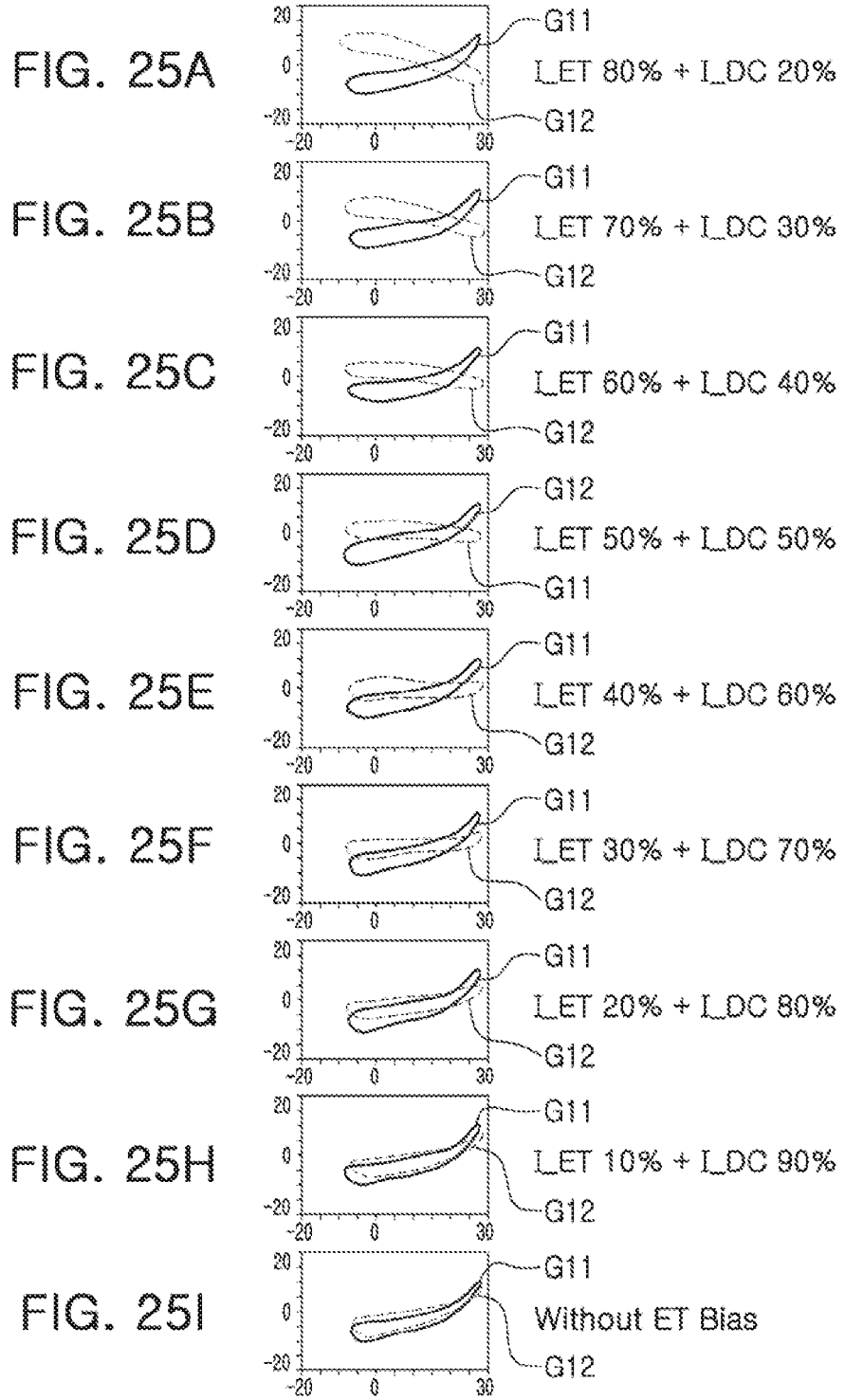

ADAPTIVE MULTIBAND POWER AMPLIFIER APPARATUS

CROSS-REFERENCE TO RELATED APPLICATIONS

This application is a continuation of U.S. patent application Ser. No. 15/719,843 filed on Sep. 29, 2017, now U.S. Pat. No. 10,374,557 issued on Aug. 6, 2019, which claims the benefit under 35 USC 119(a) of Korean Patent Application Nos. 10-2016-0141913 filed on Oct. 28, 2016, 10-2016-0156628 filed on Nov. 23, 2016 and 10-2017-0070923 filed on Jun. 7, 2017 in the Korean Intellectual Property Office, the entire disclosures of which are incorporated herein by reference for all purposes.

BACKGROUND

1. Field

The following description relates to an adaptive multiband power amplifier apparatus which may be applied to a multiband communications system.

2. Description of Related Art

Typically, a power amplifier module (PAM) serves to amplify a radio frequency (RF) signal in a transmitter and transmit the amplified RF signal to an antenna. Since such a PAM may support signals within various frequency bands, it may include a plurality of switches and filters and a plurality of power amplifiers PAs that amplify the RF signal.

The performance of such a power amplifier module (PAM) may be evaluated by maximum output, efficiency, linearity, and the like. In addition to this, since, in a cellular phone, a power amplifier module (PAM) is a component using a relatively large amount of current, current consumption is also one criteria for the performance evaluation of the power amplifier module (PAM).

As one method for reducing the current consumption of such a power amplifier module (PAM), an envelope tracking (ET) scheme or an average power tracking (APT) scheme is used. The ET causes a power voltage of the power amplifier PA to track an envelope of the RF signal, and the APT causes the power voltage VCC of the power amplifier PA to track average power of the RF signal.

In a case in which the power of the RF signal is small, such an ET or an APT may reduce average current consumption by reducing a magnitude of the power voltage of the power amplifier PA. On the contrary, in a case in which the power of the RF signal is high, the ET or the APT prevents linearity from being deteriorated by increasing the power voltage of the power amplifier PA.

In order to reduce current consumption and increase efficiency, one existing power amplifier module uses an envelope signal as the power voltage VCC or VCC_PA of the power amplifier PA by using an envelope tracking module (ETM) or an envelope tracker.

However, such an existing power amplifier module does not provide a technology for a method for efficiently supplying bias current to further reduce current consumption.

Further, the other of the existing power amplifier modules sets the power voltage VCC to change according to the envelope signal of the RF signal and provides the bias current as a fixed value defined in advance by a preset table value.

However, since the power amplifier module as described above provides the bias current as the fixed value and provides a relatively high bias current for biasing without deterioration, even in a case in which the power of the RF signal is high, the power amplifier module provides a higher bias current than necessary in a case in which the power of the RF signal is low. Therefore, there may be a problem in that the current consumption may be relatively high.

In addition, in a case in which the existing power amplifier module supplies the power voltage according to the envelope signal while using a fixed current bias manner, the power amplifier module may be coupled to an input in a phase opposite to that of an output signal of the power amplifier, and in this case, there is a problem in that amplitude modulation (AM)-phase modulation (PM) distortion characteristics may be deteriorated and adjacent channel power ratio (ACPR) performance deterioration may be caused.

An existing power amplifier circuit relates to a bias circuit using an envelope tracking (ET) bias voltage, varied based on the envelope of the input signal and a reference bias voltage, disclosed in US 2016/0126901 A1.

The invention of US 2016/0126901 A1 is an invention for maintaining a current flowing by an amplifier constant, even at low input power, as described in paragraph [0076] in US 2016/0126901 A1. According to this invention, a gain variation according to a change of a level of the input signal of the amplifier is significantly reduced by adjusting the ET bias voltage through a variable resistor.

However, according to the related art described above, different AM-PM distortion characteristics appear according to different bands of a multiband for communications. Since the related art does not consider AM-PM distortion characteristics according to each band, there is a problem in that the related art invention may not appropriately cope with a change in AM-PM distortion characteristics according to each band of the multiband.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power amplifier apparatus, includes an envelope tracking (ET) current bias circuit configured to generate a first ET bias current by calculating a direct current DC, based on a reference voltage, and an ET current, based on an ET voltage, according to an envelope of an input signal; and a power amplifier circuit having a bipolar junction transistor supplied with the first ET bias current and a power voltage to amplify the input signal, wherein an average current of the first ET bias current is controlled to be substantially constant.

A ratio of an average current of the ET current and the direct current may be adjusted according to a ratio parameter, determined in advance.

The power amplifier apparatus may further include a control circuit configured to generate a first control signal and a second control signal based on the ratio parameter to provide the generated first and second control signals to the ET current bias circuit.

The control circuit may include the ratio parameter, determined according to operating characteristics of the corresponding power amplifier circuit.

The ET current bias circuit may include: a first current source circuit configured to adjust a value of the direct current in response to the first control signal; a second current source circuit configured to adjust a value of the ET current in response to the second control signal; and a bias current generator configured to generate the first ET bias current by calculating the direct current and the ET current to supply the generated first ET bias current to a base of the bipolar junction transistor.

The bias current generator may be configured to generate the first ET bias current by connecting an output node of the first current source circuit to an output node of the second current source circuit and summing the direct current and the ET current.

The power amplifier circuit may include a power amplifier including the bipolar junction transistor and the power amplifier configured to amplify the input signal through an input terminal; and a buffered bias circuit configured to generate a second ET bias current using the first ET bias current and supplying the second ET bias current to a base of the bipolar junction transistor.

The power amplifier apparatus of may further include an ET circuit configured to generate the power voltage tracking the ET voltage to supply the generated power voltage to the power amplifier circuit, wherein the ET current bias circuit is supplied with the power voltage from the ET circuit to generate the ET current.

The power amplifier apparatus further including an envelope detection circuit detecting the ET voltage, wherein the ET current bias circuit is supplied with the ET voltage from the envelope detection circuit to generate the ET current.

The power amplifier apparatus further including: an envelope detection circuit configured to detect the ET voltage; and an APT circuit configured to generate the power voltage tracking an average voltage of the ET voltage to supply the generated power voltage to the power amplifier circuit, wherein the ET current bias circuit is supplied with the ET voltage from the envelope detection circuit to generate the ET current.

The buffered bias circuit may include: a current bias circuit connected between an output terminal of the ET current bias circuit and a ground; a current amplifier current-biased by the current bias circuit to amplify the first ET bias current and generating the second ET bias current; and a ballast resistor connected to an output terminal outputting the second ET bias current.

The power amplifier apparatus of claim, wherein the ballast resistor may have a resistance value, set according to the ratio parameter.

The current bias circuit may include a first bias resistor connected between the output terminal of the ET current bias circuit and a base of the current amplifier; and a temperature compensation circuit connected between the base of the current amplifier and the ground and having a resistance value, varied according to a temperature.

The temperature compensation circuit may include at least two diode-connected transistors connected between the base of the current amplifier and the ground in series.

The temperature compensation circuit may include at least two diodes connected between the base of the current amplifier and the ground in series.

According to another general aspect, a power amplifier apparatus includes an envelope tracking (ET) current bias circuit configured to generate a first ET bias current by calculating a direct current DC, based on a reference voltage, and an ET current, based on an ET voltage, according to an envelope of an input signal; and a power amplifier circuit including first to n-th power amplifier circuits, wherein each of the first to n-th power amplifier circuits has a bipolar junction transistor supplied with the first ET bias current and a power voltage to amplify the input signal, wherein an average current of the first ET bias current is controlled to be constant.

A ratio of an average current of the ET current and the direct current may be adjusted according to a ratio parameter, determined in advance.

The power amplifier apparatus may further include a control circuit generating a first control signal and a second control signal based on the ratio parameter to provide the generated first and second control signals to the ET current bias circuit.

The control circuit may include the ratio parameter, determined according to operating characteristics of each of the first to n-th power amplifier circuits.

The power amplifier apparatus, wherein the ET current bias circuit may include a first current source circuit configured to adjust a value of the direct current in response to the first control signal; a second current source circuit configured to adjust a value of the ET current in response to the second control signal; and a bias current generator configured to generate the first ET bias current by calculating the direct current and the ET current to supply the generated first ET bias current to a base of the bipolar junction transistor.

The bias current generator may be configured to generate the first ET bias current by connecting an output node of the first current source circuit to an output node of the second current source circuit and summing the direct current and the ET current.

The power amplifier apparatus, wherein each of the first to n-th power amplifier circuits may include: a power amplifier comprising the bipolar junction transistor and amplifying the input signal through an input terminal; and a buffered bias circuit configured to generate a second ET bias current using the first ET bias current and supplying the second ET bias current to a base of the bipolar junction transistor.

The power amplifier apparatus may further include an ET circuit generating the power voltage tracking the ET voltage to supply the generated power voltage to the power amplifier circuit, wherein the ET current bias circuit is supplied with the power voltage from the ET circuit to generate the ET current.

The power amplifier apparatus may further include an envelope detection circuit detecting the ET voltage, wherein the ET current bias circuit is supplied with the ET voltage from the envelope detection circuit to generate the ET current.

The power amplifier apparatus may further include: an envelope detection circuit configured to detect the ET voltage; and an APT circuit configured to generate the power voltage tracking an average voltage of the ET voltage to supply the generated power voltage to the power amplifier circuit, the ET current bias circuit is supplied with the ET voltage from the envelope detection circuit to generate the ET current.

The buffered bias circuit may include: a current bias circuit connected between an output terminal of the ET current bias circuit and a ground; a current amplifier current-biased by the current bias circuit to amplify the first ET bias current and generating the second ET bias current; and a ballast resistor connected to an output terminal outputting the second ET bias current.

The ballast resistor may have a resistance value, set according to the ratio parameter.

The current bias circuit may include: a first bias resistor connected between the output terminal of the ET current bias circuit and a base of the current amplifier; and a temperature compensation circuit connected between the base of the current amplifier and the ground and having a resistance value, varied according to a temperature.

The temperature compensation circuit may include at least two diode-connected transistors connected between the base of the current amplifier and the ground in series.

The power amplifier apparatus, wherein the temperature compensation circuit may comprise at least two diodes connected between the base of the current amplifier and the ground in series.

Other features and aspects will be apparent from the following detailed description, the drawings, and the claims.

BRIEF DESCRIPTION OF DRAWINGS

FIGS. 25A through 25I are views illustrating an amplitude modulation-phase modulation (AM-PM) distortion simulation according to a ratio of an ET current and a direct current according to an embodiment Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
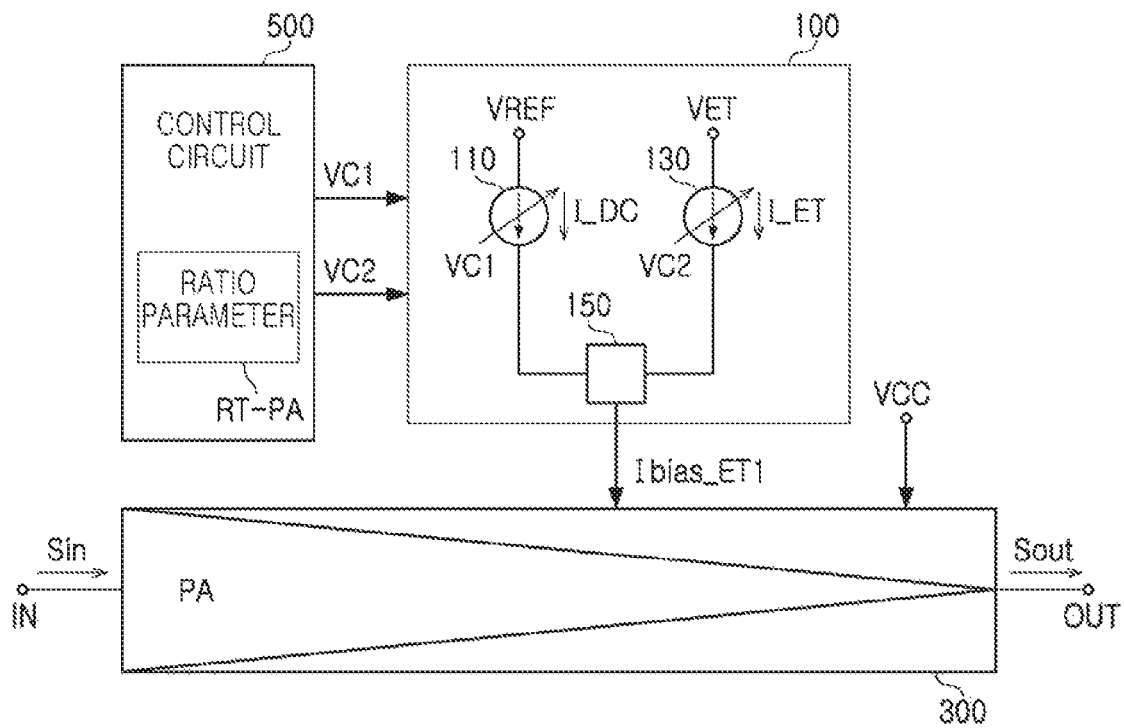
FIG. 1 is a view of a power amplifier apparatus according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "connected to" or "coupled to" another element, it may be directly "connected to" or "coupled to" the other element, or there may be one or more other elements intervening therebetween. In contrast, when an element is described as being "directly connected to" or "directly coupled to" another element, there can be no other elements intervening therebetween.

As used herein, the term "and/or" includes any one and any combination of any two or more of the associated listed items.

Although terms such as "first," "second," and "third" may be used herein to describe various members or components, these members or components are not to be limited by these terms. Rather, these terms are only used to distinguish one member or component from another member or component. Thus, a first member or component referred to in examples described herein may also be referred to as a second member or component without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Due to manufacturing techniques and/or tolerances, Variations of the shapes shown in the drawings may occur. Thus, the examples described below are not to be construed as being limited to the particular shapes of regions shown in the drawings, but include changes in shape occurring during manufacturing.

FIG. 1 is a view of a power amplifier apparatus according to an embodiment.

Referring to FIG. 1, a power amplifier apparatus according to an embodiment includes an envelope tracking (ET) current bias circuit 100 and a power amplifier circuit 300. In addition, the power amplifier apparatus, according to one or more embodiments, further includes a control circuit 500.

Referring to FIG. 1, the ET current bias circuit 100 generates a first ET bias current Ibias_ET1 by calculating a direct current (DC) I_DC based on a reference voltage VREF and an ET current I_ET based on an ET voltage VET according to an envelope of an input signal.

Here, the ET current I_ET includes, according to embodiment, a current, instantaneously changed according to the envelope of the input signal, and the direct current I_DC is a current based on the reference voltage VREF regardless of the envelope of the input signal.

The power amplifier circuit 300 includes a bipolar junction transistor (BJT) supplied with the first ET bias current Ibias_ET1 and a power voltage VCC to amplify the input signal.

Here, since the ET current I_ET is instantaneously changed, the first ET bias current Ibias_ET1 is also instantaneously changed, but in order to improve efficiency of the power amplifier circuit, an average current of the first ET bias current Ibias_ET1 is controlled to be constant. In a case in which the average current of the first ET bias current Ibias_ET1 is constant, output power and efficiency, performance indexes of the power amplifier circuit, are, according to embodiment, maintained to be constant.

The constant average current of the first ET bias current Ibias_ET1 is a current within an allowable range in which the output power and the efficiency of the power amplifier circuit do not deviate from a required range in a specification. As an example, when the allowable range of the average current of the first ET bias current Ibias_ET1 is 400 μA±a, 400 μA is the average current of the first ET bias current Ibias_ET1 and "a" is a tolerance. The tolerance is, for example, 10% of the average current of the first ET bias current Ibias_ET1, and as an example, when the average current of the first ET bias current Ibias_ET1 is 400 μA, the tolerance "a" may be 25 μA. Therefore, the average current of the first ET bias current Ibias_ET is changed within the allowable range.

In addition, in order to improve AM-PM distortion of the power amplifier circuit, the ratio of the average current of the ET current I_ET and the direct current I_DC may be adjusted according to a ratio parameter RT-PA, determined in advance. That is, when the ratio of the average current of the ET current I_ET and the direct current I_DC is adjusted according to the ratio parameter RT-PA, AM-PM distortion is optimally reduced.

The control circuit 500 generates a first control signal VC1 and a second control signal VC2 based on the ratio parameter RT-PA to provide the generated first and second control signals VC1 and VC2 to the ET current bias circuit 100.

The control circuit 500 includes the ratio parameter RT-PA determined according to operating characteristics of the corresponding power amplifier circuit. Here, the operating characteristics of the corresponding power amplifier circuit include any one, or any combination of two or more of a frequency band, a gain, output power, a band width, and a power mode for the corresponding power amplifier circuit.

The multiband power amplifier apparatus amplifies an input signal for each of frequency bands of a multiband for communications. As an example, in a case in which a frequency band of an input signal is changed, AM-PM distortion characteristics are changed for the corresponding frequency band, and in order to reduce AM-PM distortion characteristics, changed as described above to the minimum in the corresponding frequency band, the ratio of the average current of the ET current I_ET and the direct current I_DC are adjusted according to the ratio parameter RT-PA. Accordingly, AM-PM distortion is optimally reduced in the corresponding frequency band.

In addition, the power mode is classified into at least two operation power modes for the corresponding power amplifier circuit, and as an example, the power mode is a high power mode or a low power mode.

As an example, the ratio parameter RT-PA is a specific value, defined in the range of 0 to 100, where in a case in which the ratio parameter RT-PA is 0, the ratio of the average current of the ET current I_ET is 0% and the ratio of the average current of the ET current I_ET and the direct current I_DC are, for example, 100%, in a case in which the ratio parameter RT-PA is 50, the ratio of the average current of the ET current I_ET is, for example, 50% and the ratio of the average current of the ET current I_ET and the direct current I_DC is 50%, and in a case in which the ratio parameter RT-PA is 100, the ratio of the average current of the ET current I_ET is 100% and the ratio of the average current of the ET current I_ET and the direct current I_DC is 0%.

As such, in order to adjust the ratio of the average current of the ET current I_ET and the ratio of the direct current I_DC, the control circuit 500 may generate a first control signal VC1 and a second control signal VC2 based on the ratio parameter RT-PA.

The numeric values for the ratio parameter RT-PA described above are merely illustrative and are not limited thereto. Further, the ratio parameter RT-PA is preset, in one or more embodiments, based on influence factors that vary AM-PM distortion characteristics of the power amplifier circuit, and the influence factors are any one, or any combination of two or more of a frequency band, a bandwidth, a gain, output power, and a power mode.

As an example, the ET current bias circuit 100 includes a first current source circuit 110, a second current source circuit 130, and a bias current generator 150.

The first current source circuit 110 adjusts a value of the direct current I_DC in response to the first control signal VC1, and the second current source circuit 130 adjusts a value of the ET current I_ET in response to the second control signal VC2.

In addition, the bias current generator 150 generates the first ET bias current Ibias_ET1 by calculating the direct current I_DC and the ET current I_ET to supply the generated first ET bias current to a base of the bipolar junction transistor (BJT) of the power amplifier circuit 300.

The bias current generator 150 generates the first ET bias current Ibias_ET1 by adding or subtracting the direct current I_DC and the ET current I_ET. Here, the addition or the subtraction are selected according to operating characteristics of the corresponding power amplifier circuit as described, for example, with reference to FIG. 13.

As an example, the bias current generator 150 generates the first ET bias current Ibias_ET1 by connecting an output node of the first current source circuit 110 with an output node of the second current source circuit 130 and summing the direct current I_DC and the ET current I_ET.

Accordingly, as illustrated in FIG. 25 and described below, the first ET bias current Ibias_ET1 is determined by a ratio of a value of the direct current I_DC adjusted in response to the first control signal VC1 and a value of the ET current I_ET adjusted in response to the second control signal VC2.

The first current source circuit 110 and the second current source circuit 130 are described with reference to FIGS. 17 and 18.

The control circuit 500 includes at least one processing unit and a memory.

The processing unit or processor includes, for example, a central processing unit (CPU), a graphic processing unit (GPU), a microprocessor, an application specific integrated circuit (ASIC), a field programmable gate array (FPGA), or any other processing device, and may have a plurality of cores. The memory is a volatile memory (e.g., a random access memory (RAM), or other suitably fast storage and retrieval device), a non-volatile memory (e.g., a read only memory (ROM), a flash memory, or the like), or a combination thereof.

In the drawings, unnecessary overlapped descriptions are omitted for components having the same reference numeral and the same function, and possible differences in the respective drawings will be described.

The power amplifier circuit 300 according to the respective embodiments also includes at least one power amplifier.

Figure 2:
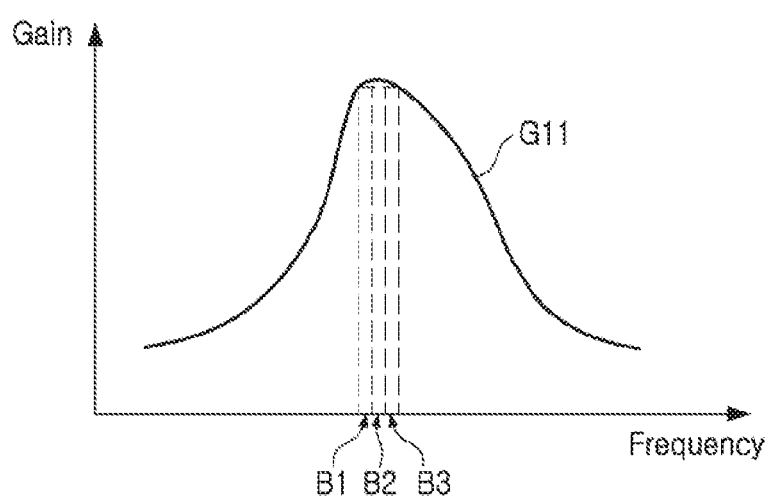
FIG. 2 illustrates gain and band characteristics of a power amplifier apparatus of FIG. 1.

FIG. 2 is a characteristic view of a gain and a band of the power amplifier apparatus of FIG. 1.

Referring to FIGS. 1 and 2, in a case in which the power amplifier circuit 300 includes one power amplifier, G11 in FIG. 2 is a gain characteristics graph of the one power amplifier.

The one power amplifier, according to an embodiment, covers a plurality of frequency bands e.g. B1, B2, and B3, each adjacent to each other. As an example, the one power amplifier has various power modes. Depending on the power modes, a necessary average bias current is varied. Accordingly, the ratio of the ET current I_ET and the direct current I_DC, required for the one power amplifier is also varied.

As described above, such a ratio of the ET current I_ET and the direct current I_DC are determined in response to the first control signal VC1 and the second control signal VC2, determined according to the ratio parameter RT-PA.

As an example, when a high power mode of a Band1 requires the average current of 500 μA, the first ET bias current Ibias_ET1 is adjusted to an optimal ratio of the ET current I_ET and the direct current I_DC by varying the first control signal VC1 and the second control signal VC2 while maintaining an average of 500 μA. As another example, when the power amplifier is operated in a low power mode of a band Band2, the first ET bias current Ibias_ET1 is adjusted to the optimal ratio of the ET current I_ET and the direct current I_DC by fixing a required average current of the first ET bias current Ibias_ET1 to 200 μA and varying the first control signal VC1 and the second control signal VC2.

Figure 3:
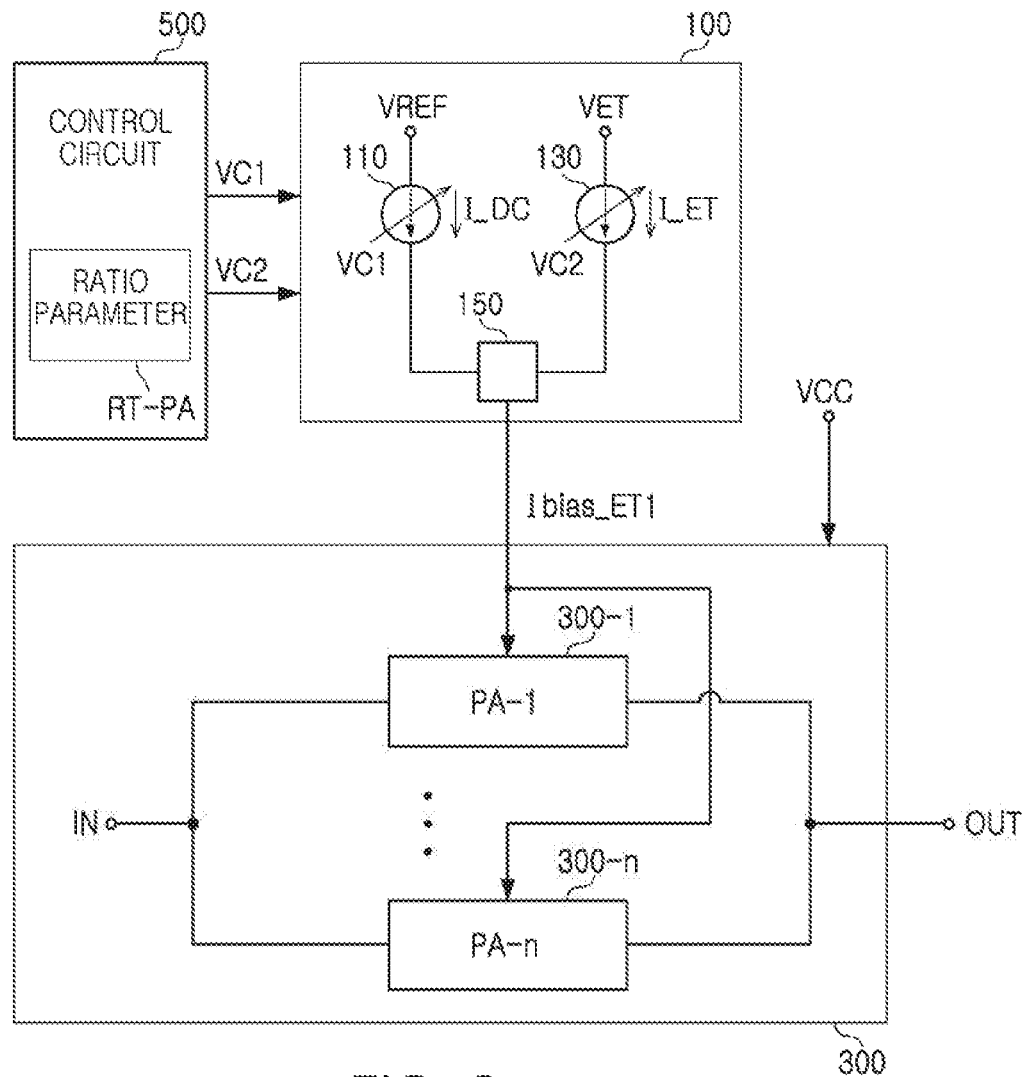
FIG. 3 is another view of a power amplifier apparatus according to an embodiment.

FIG. 3 is another view of a power amplifier apparatus according to an embodiment.

Referring to FIG. 3, a power amplifier apparatus according to an embodiment include the ET current bias circuit 100 and the power amplifier circuit 300. In addition, the power amplifier apparatus further includes the control circuit 500 in one or more embodiments. An overlapped description with reference to FIGS. 1 and 2 may be omitted for clarity and conciseness.

The power amplifier circuit 300 includes first to n-th power amplifier circuits 300-1 to 300-n, and each of the first to n-th power amplifier circuits 300-1 to 300-n may share one ET current bias circuit 100.

The first to n-th power amplifier circuits 300-1 to 300-n (where n is a natural number of 2 or more) may be operated in a time division duplex (TDD) mode to be supplied with the first ET bias current from the ET current bias circuit 100 and to be operated for a corresponding frequency band.

For example, the average current of the first ET bias current supplied to each of the first to n-th power amplifier circuits 300-1 to 300-n are constant, and the ratio of the average current of the ET current and the direct current are differently or separately adjusted according to the corresponding ratio parameter.

As an example, the first power amplifier circuit 300-1 operates for the band 1, and the ratio parameter corresponding to the band 1 may be set. In addition, the n-th power amplifier circuit 300-n operates for the band n, and the ratio parameter corresponding to the band n is set.

Figure 4:
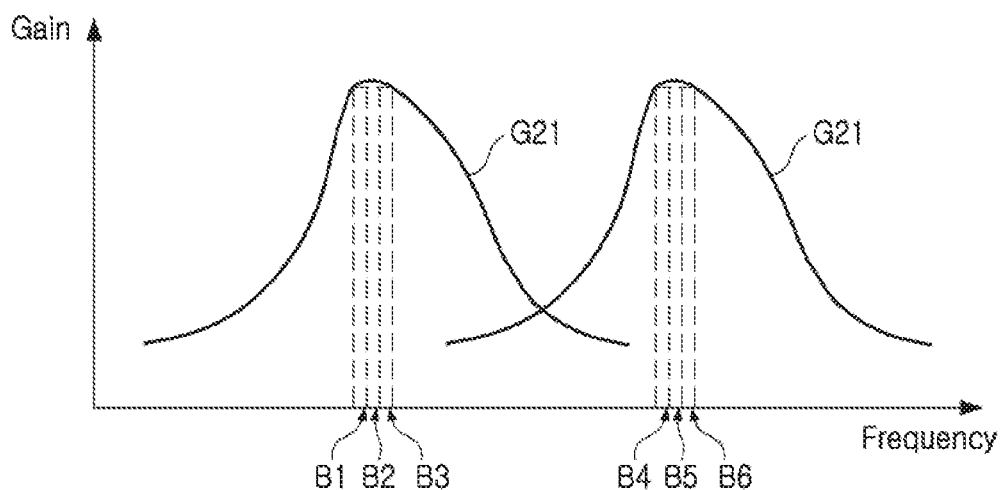
FIG. 4 illustrates gain and band characteristics of the power amplifier apparatus of FIG. 3.

FIG. 4 illustrates gain and band characteristics of the power amplifier apparatus of FIG. 3.

Referring to FIGS. 3 and 4, as an example, the power amplifier circuit 300 includes first and second power amplifiers. In FIG. 4, G21 is a gain characteristic graph of the first power amplifier and G22 is a gain characteristic graph of the second power amplifier.

The first power amplifier and the second power amplifier may, according to one or more embodiments, not be simultaneously operated and may, rather, be operated in the TDD mode.

The first power amplifier may cover a plurality of bands (a band 1 B1, a band 2 B2, and a band 3 B3), and the ratio of the average current of the ET current and the direct current included in the first ET bias current may be changed according to each of the plurality of bands (the band 1 B1, the band 2 B2, and the band 3 B3).

In addition, the second power amplifier covers a plurality of bands (a band 4 B4, a band 5 B5, and a band 6 B6), and the ratio of the average current of the ET current and the direct current included in the first ET bias current are changed according to each of the plurality of bands (the band 4 B4, the band 5 B5, and the band 6 B6).

As such, even in a case in which the power amplifier circuit 300 includes a plurality of power amplifiers, each of the plurality of power amplifiers are supplied with the first ET bias current having the ratio of the average current of the ET current and the direct current according to the corresponding ratio parameter. Also in this case, the average current of the first ET bias current may be controlled to be constant.

As described above, the first ET bias currents Ibias_ET1, different from each other according to the corresponding ratio parameter RT-PA, determined according to the operating power amplifier, the power mode of the operating power amplifier, the frequency band of the operating power amplifier, and the like may be required, and in order to operate the power amplifier at a substantially optimal point, the first ET bias current Ibias_ET1 is fixed at a fixed value and the ratio of the direct current and the ET current of the first ET bias current are adjusted to a substantially optimal ratio using the first and second control signals VC1 and VC2.

Thereafter, values of the first and second control signals VC1 and VC2 are stored in a corresponding register and are changed to the first and second control signals VC1 and VC2 according to the ratio parameter when any one or any combination or two or more of the operating power amplifier, the power mode of the operating power amplifier, and the frequency band of the operating power amplifier are selected.

Figure 5:
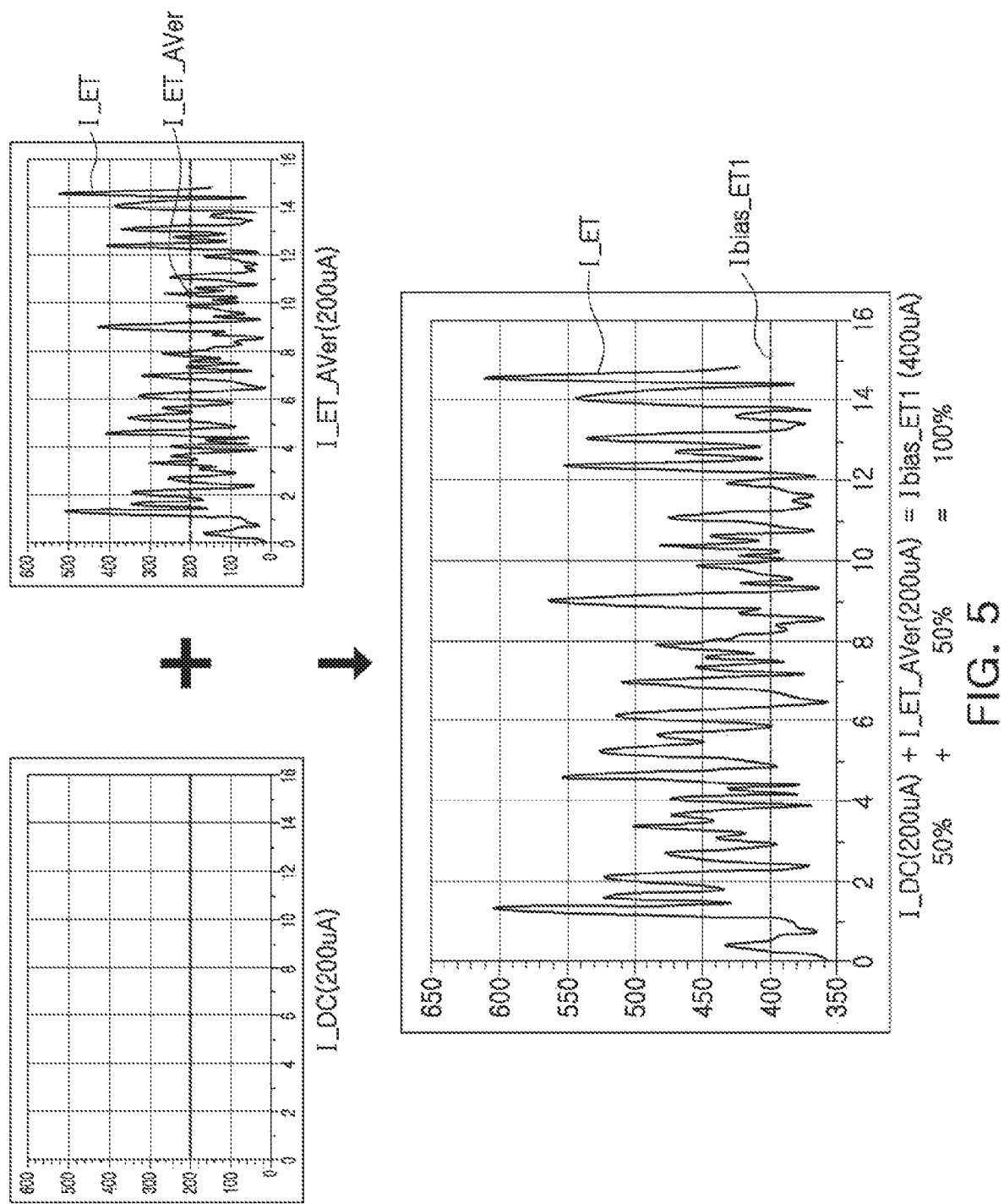
FIG. 5 is a view illustrating generating a first ET bias current according to an embodiment.

FIG. 5 is a view illustrating a principle of generating the first ET bias current according to an embodiment.

Referring to FIGS. 1 through 5, when the first ET bias current of the ET current bias circuit 100 requires the average current of 400 µA in the corresponding power mode of the corresponding band, the first ET bias current Ibias_ET1 adjusts an average current I_ET_Aver of the ET current I_ET to 200 µA and the direct current I_DC to 200 µA by varying the first control signal VC1 and the second control signal VC2 while maintaining the average current of 400 µA.

Accordingly, the first ET bias current Ibias_ET1 becomes 400 µA by summing the average current I_ET_Aver of the ET current I_ET of 200 µA and the direct current I_DC of 200 µA.

Figure 6:
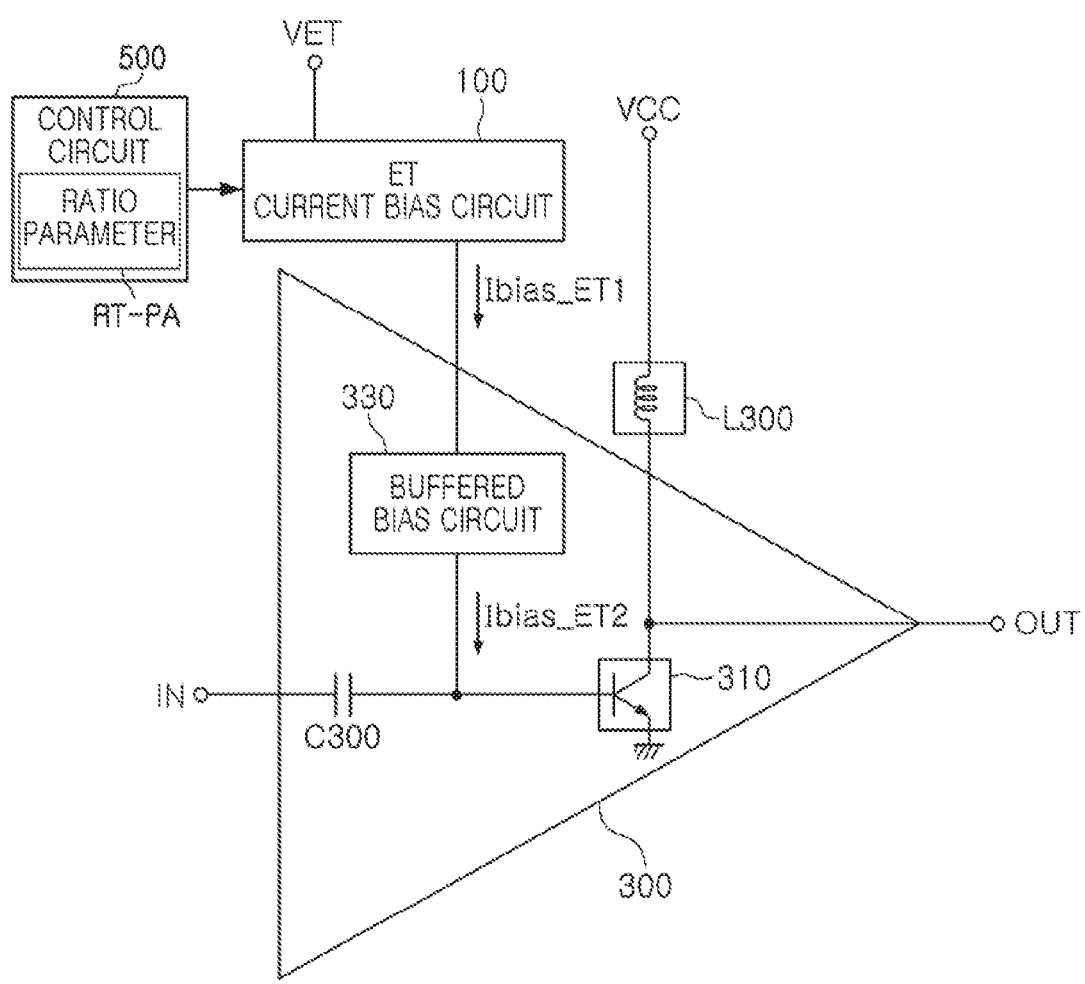
FIG. 6 is a view of a power amplifier apparatus according to an embodiment.

FIG. 6 is a view of a power amplifier apparatus according to an embodiment.

Referring to FIG. 6, the power amplifier circuit 300 includes at least one power amplifier circuit, and according to embodiment, may include a plurality of first to n-th power amplifier circuits 300-1 to 300-n (where n is a natural number of 2 or more).

The one power amplifier circuit, or each of the plurality of first to n-th power amplifier circuits 300-1 to 300-n include a power amplifier 310 and a buffered bias circuit 330.

The power amplifier 310 includes the bipolar junction transistor BJT, and amplifies an input signal through an input terminal IN to provide the amplified input signal through an output terminal OUT.

The buffered bias circuit 330 amplifies the first ET bias current Ibias_ET1 to generate a second ET bias current Ibias_ET2 and supplies the second ET bias current Ibias_ET2 to a base of the bipolar junction transistor (BJT) to reduce an amplitude modulation-phase modulation (AM-PM) distortion of the power amplifier circuit 300.

As an example, in a case in which the buffered bias circuit 330 has a current gain of about 110 times, the buffered bias circuit 330 amplifies the first ET bias current Ibias_ET1 of a microampere (µA) level to the second ET bias current Ibias_ET2 of a milliampere (mA) level.

In addition, the ET current bias circuit 100 reduces the amplitude modulation-phase modulation (AM-PM) of the power amplifier circuit 300 by supplying the first ET bias current Ibias_ET1 to a base of the power amplifier circuit 300.

In FIG. 6, C300 is a capacitor configured to block a direct current and L300 is an inductor configured to block power noise.

Figure 7:
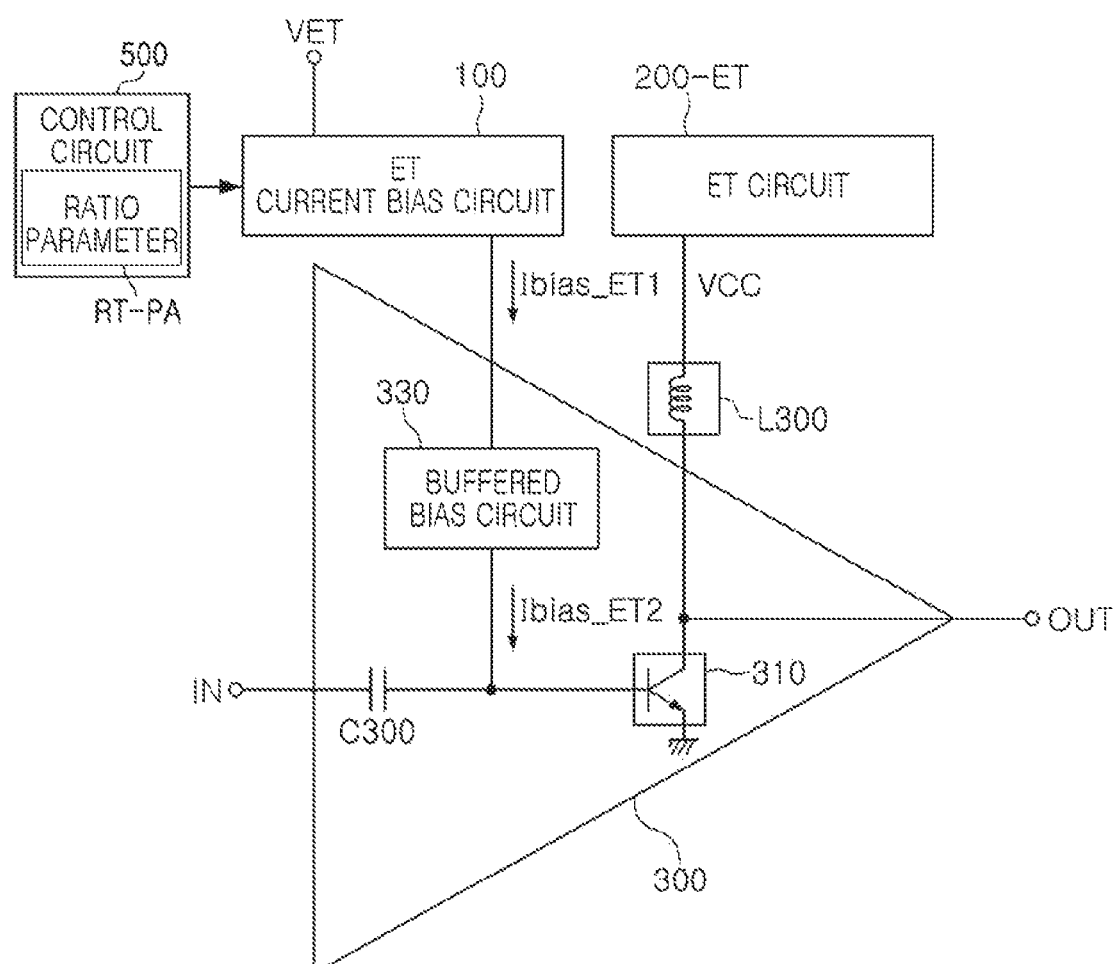
FIG. 7 is another view of a power amplifier apparatus according to an embodiment.

FIG. 7 is another view of a power amplifier apparatus according to an embodiment.

Referring to FIG. 7, the power amplifier apparatus further includes an ET circuit 200-ET.

The ET circuit 200-ET generates the power voltage VCC tracking the ET voltage VET to supply the generated power voltage VCC to the power amplifier circuit 300.

The ET current bias circuit 100 generates the first ET bias current Ibias_ET1 using the ET voltage VET corresponding to an envelope of an input signal Sin.

The power amplifier circuit 300 is current-biased by the first ET bias current Ibias_ET1 to amplify the input signal Sin.

Figure 8:
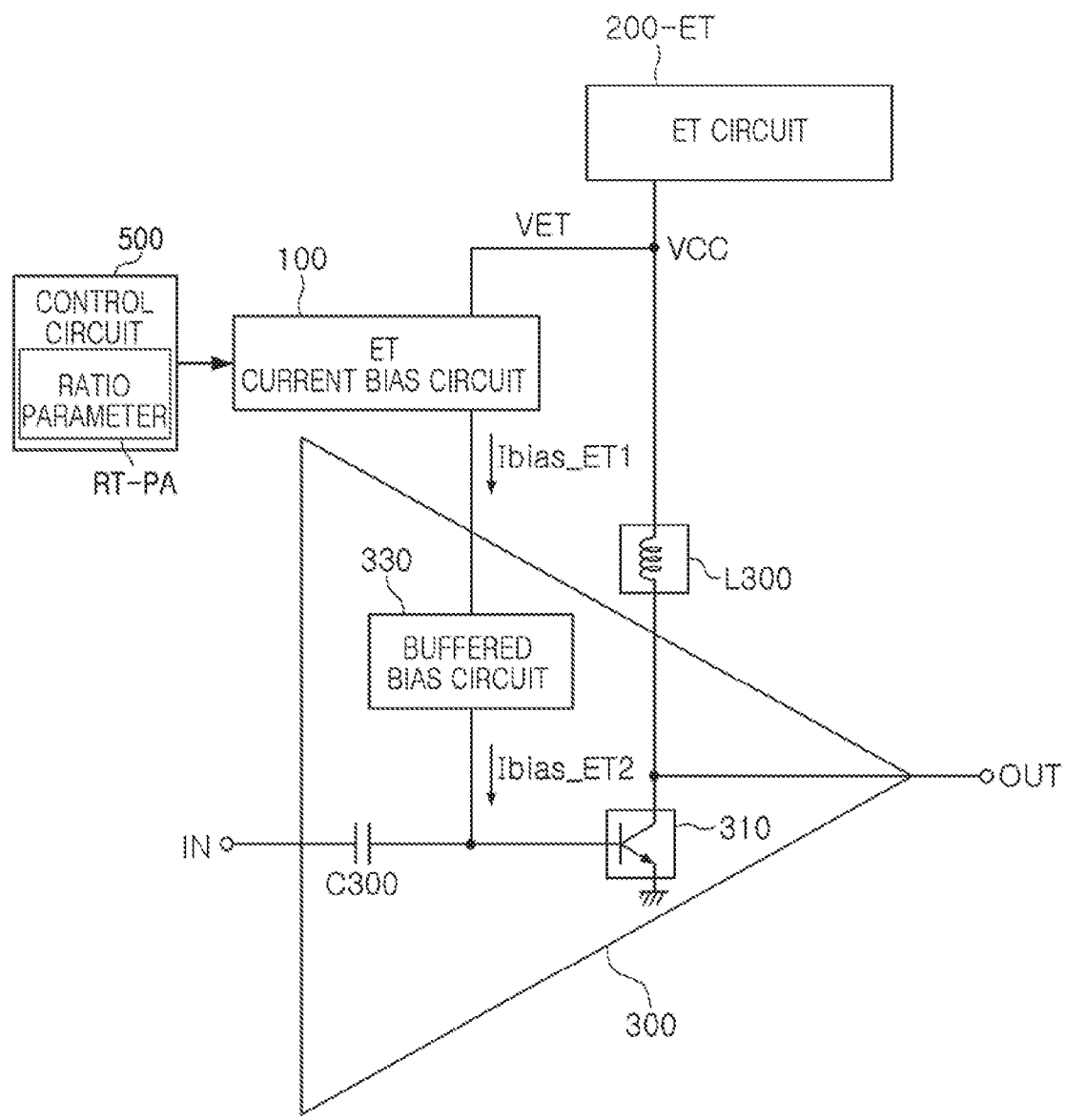
FIG. 8 is another view of a power amplifier apparatus according to an embodiment.

FIG. 8 is another view of a power amplifier apparatus according to an embodiment.

Referring to FIG. 8, the power amplifier apparatus further includes an ET circuit 200-ET in addition to the structure of FIG. 6, and the ET circuit 200-ET may supply an ET voltage VET according to an envelope of an input signal to the power amplifier circuit 300 as the power voltage VCC.

As an example, the ET current bias circuit 100 may be supplied with the power voltage VCC from the ET circuit 200-ET as the ET voltage VET.

Figure 9:
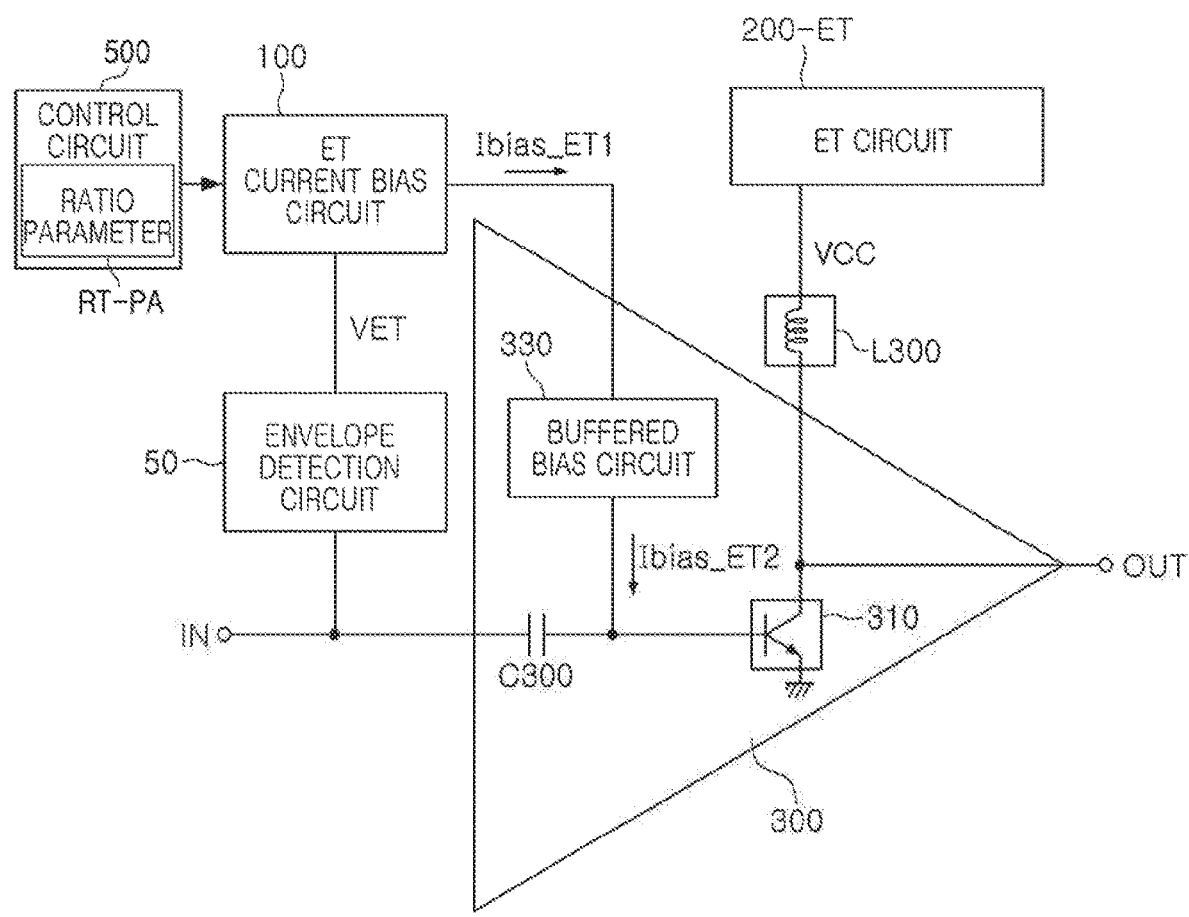
FIG. 9 is another view of a power amplifier apparatus according to an embodiment.

FIG. 9 is another view of a power amplifier apparatus according to an embodiment.

Referring to FIG. 9, the power amplifier apparatus further includes an envelope detection circuit 50 in addition to the structure of FIG. 7, the envelope detection circuit 50 detects the ET voltage VET corresponding to the envelope of the input signal, and the ET voltage VET is supplied to the ET current bias circuit 100.

Accordingly, the ET current bias circuit 100 is supplied with the ET voltage VET from the envelope detection circuit 50.

Figure 10:
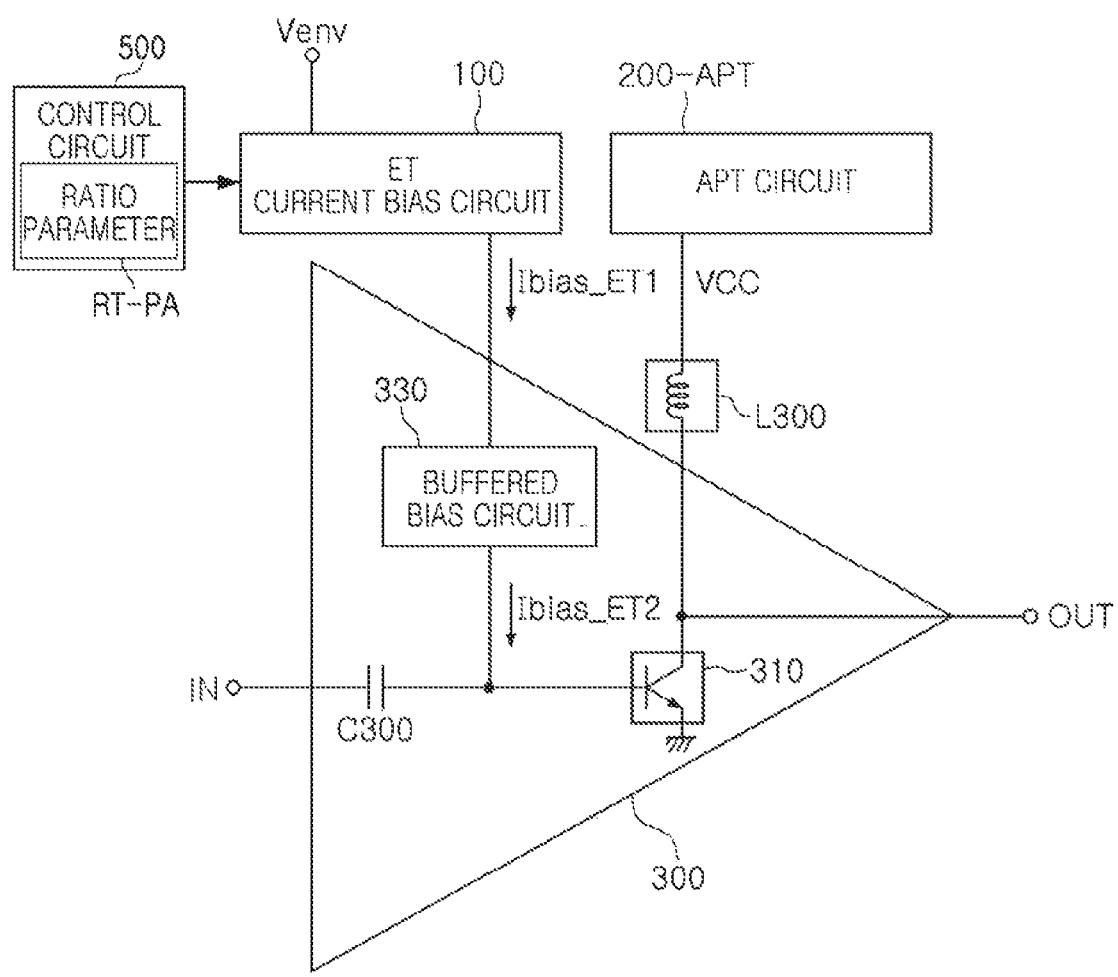
FIG. 10 is another view of a power amplifier apparatus according to an embodiment.
Figure 11:
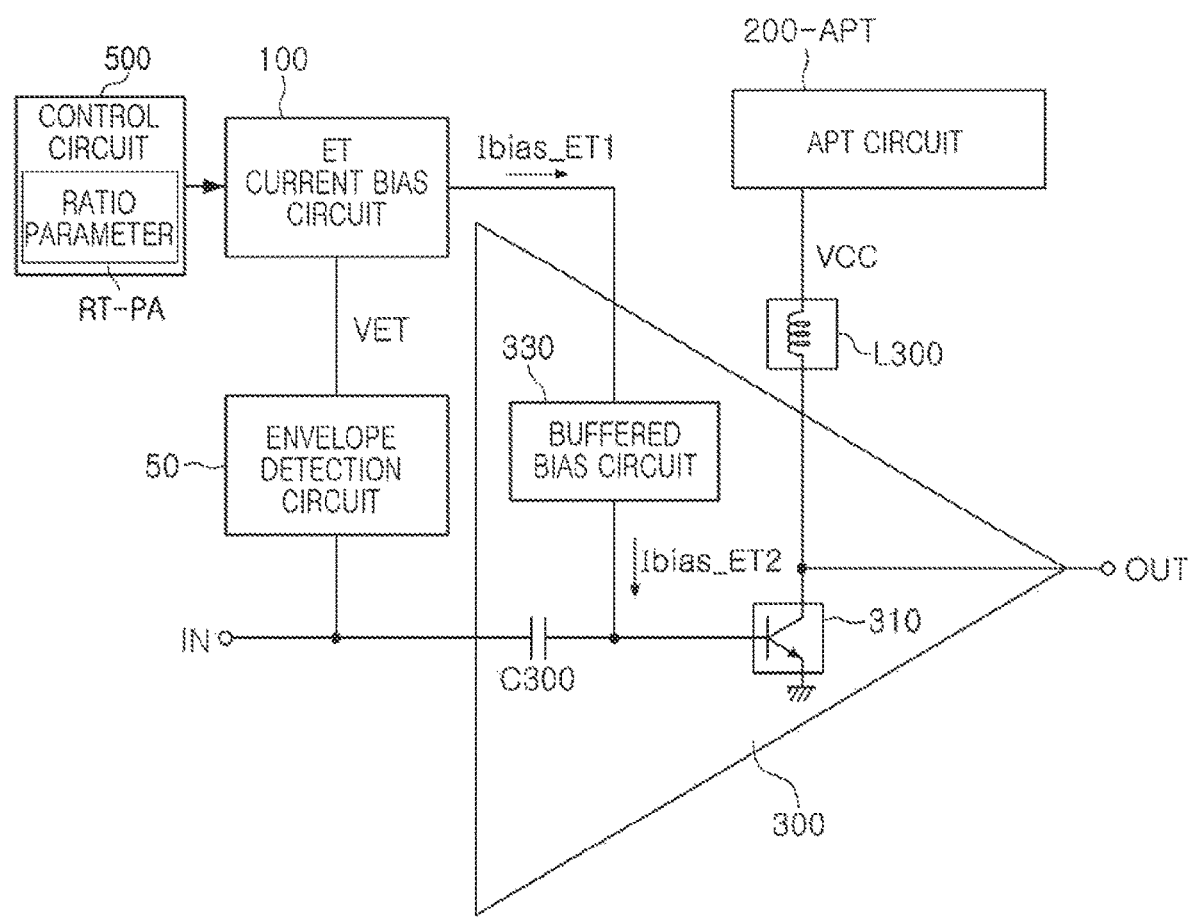
FIG. 11 is another view of a power amplifier apparatus according to an embodiment.

FIG. 10 is another view of a power amplifier apparatus according to an embodiment and FIG. 11 is another view of a power amplifier apparatus according to an embodiment.

Referring to FIG. 10, the power amplifier apparatus further includes an APT circuit 200-APT. The APT circuit 200-APT generates the power voltage VCC tracking an average voltage of the ET voltage VET to supply the generated power voltage VCC to the power amplifier circuit 300.

Referring to FIG. 11, the power amplifier apparatus includes the envelope detection circuit 50 and the APT circuit 200-APT.

The envelope detection circuit 50 detects the ET voltage VET. The APT circuit 200-APT generates the power voltage VCC tracking an average voltage of the ET voltage VET to supply the generated power voltage VCC to the power amplifier circuit 300.

The ET current bias circuit 100 is supplied with the ET voltage VET from the envelope detection circuit 50 to generate the ET current I_ET.

Figure 12:
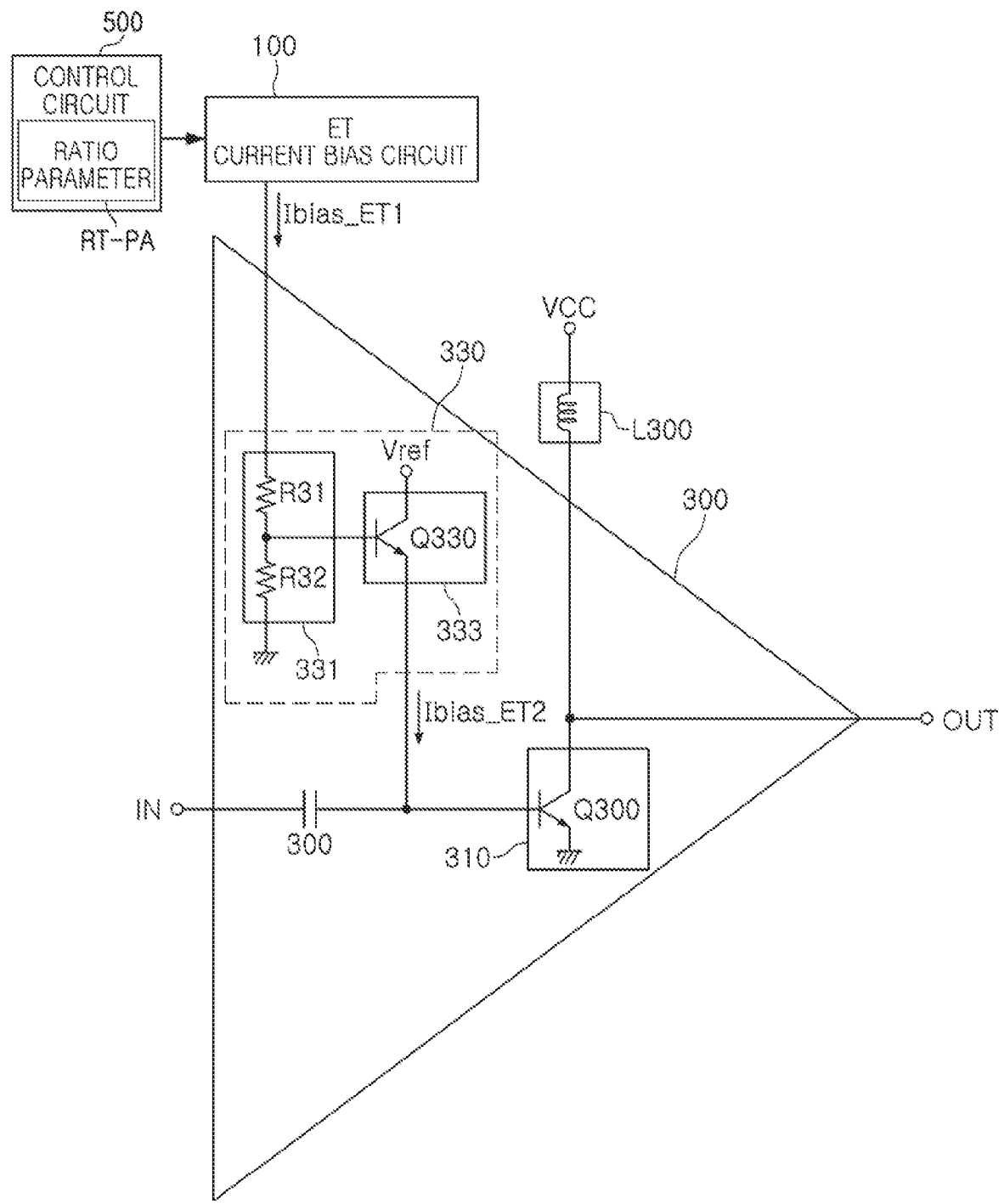
FIG. 12 is a view of a power amplifier circuit according to an embodiment.

FIG. 12 is a view of a power amplifier circuit according to an embodiment.

Referring to FIG. 12, the buffered bias circuit 330 includes a current bias circuit 331 and a current amplifier 333.

Figure 13:
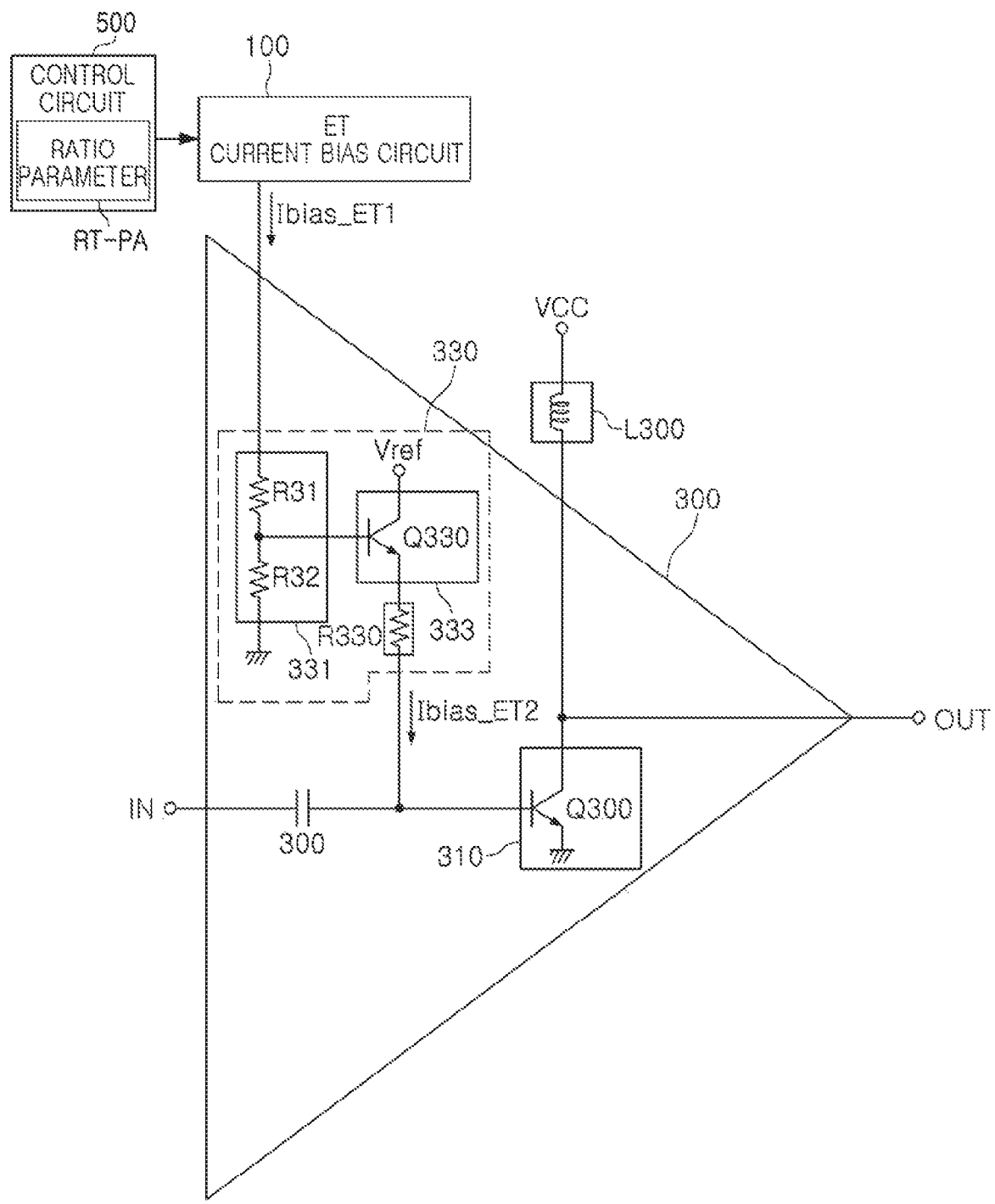
FIG. 13 is a view of a power amplifier circuit according to an embodiment

FIG. 13 is a view of a power amplifier circuit according to an embodiment.

Referring to FIG. 13, the buffered bias circuit 330 includes the current bias circuit 331, the current amplifier 333, and a ballast resistor R330.

Referring to FIGS. 12 and 13, according to one or more embodiments, the buffered bias circuit 330 does not include the ballast resistor R330 or may include the ballast resistor R330 according to the operating characteristics of the corresponding power amplifier circuit. As an example, in a case in which output power of the corresponding power amplifier circuit needs to be relatively increased, the buffered bias circuit 330 may not include the ballast resistor R330.

The current bias circuit 331 is connected, according to an embodiment, between an output terminal of the ET current bias circuit 100 and a ground. As an example, the current bias circuit 331 includes two resistors R31 and R32 to configure a voltage distribution bias circuit.

The current amplifier 333 is current-biased by the current bias circuit 331 to amplify the first ET bias current Ibias_ET1, thereby generating the second ET bias current Ibias_ET2. As an example, the current amplifier 333 includes a bipolar junction transistor (BJT) Q330 having a collector supplied with a reference voltage VREF, an emitter connected to the ground, and a base connected to the current bias circuit 331.

The ballast resistor R330 is connected to an output terminal that outputs the second ET bias current Ibias_ET2 so that a base-emitter voltage VBE of the bipolar junction transistor (BJT) Q330 is able to be adjusted according to a resistance value of the ballast resistor R330, and accordingly, in a case in which the resistance value of the ballast resistor R330 is appropriately set, the amplitude modulation-phase modulation (AM-PM) distortion of the power amplifier circuit 300 is beneficially reduced.

The ballast resistor R330 has the resistance value set according to the ratio parameter (RT-PA) to reduce the amplitude modulation-phase modulation (AM-PM) distortion in the frequency band of the input signal.

In addition, the power amplifier 310 included in the power amplifier circuit 300 includes the bipolar junction transistor (BJT) Q300 supplied with the second ET bias current Ibias_ET2 through the base thereof.

The collector of the bipolar junction transistor (BJT) Q300 is supplied with the power voltage VCC through a coil L300 and is input with the input signal through the capacitor C300 for blocking the direct current connected to the signal input terminal IN.

Meanwhile, referring to FIGS. 1, 3, and 13, the bias current generator 150 generates the first ET bias current Ibias_ET1 by adding or subtracting the direct current I_DC and the ET current I_ET.

For example, in a case in which a DC boosting occurs for a base voltage of the power amplifier circuit as the ballast resistor R330 is relatively small and amplitude of the input signal is increased, the bias current generator 150 performs a subtraction function. On the contrary, in a case in which a value of the base voltage of the power amplifier circuit is reduced as the ballast resistor R330 is relatively high and the amplitude of the input signal is increased, the bias current generator 150 performs an addition function.

On the other hand, referring to FIGS. 3, 4, and 13, the first ET bias currents Ibias_ET1, distinguished from each other according to the ballast resistor R330, the operating power amplifier, the power mode of the operating power amplifier, and the frequency band of the operating power amplifier may be required, and in order to operate the power amplifier at a substantially optimal point, the first ET bias current Ibias_ET1 is fixed at a fixed value and the ratio of the direct current and the ET current of the first ET bias current are adjusted to a substantially optimal ratio by controlling the ET current bias circuit 100 using the first and second control signals VC1 and VC2.

Thereafter, values of the first and second control signals VC1 and VC2 are stored in a corresponding register and are changed according to the ratio parameter when the operating power amplifier, the power mode of the operating power amplifier, and the frequency band of the operating power amplifier, are selected.

Meanwhile, the base voltage of the power amplifier 310 is increased by a second order distortion component by the buffered bias circuit 330 and the base voltage of the power amplifier 310 is adjusted according to a resistance value of the ballast resistor R330 by adding the ballast resistor R330. In a case in which the resistance value of the ballast resistor R330 is high, a change in the base voltage of the power amplifier 310 is decreased and a change in base-collector capacitance Ccb of the power amplifier 310 is decreased, thereby reducing AM-PM distortion.

Figure 14:
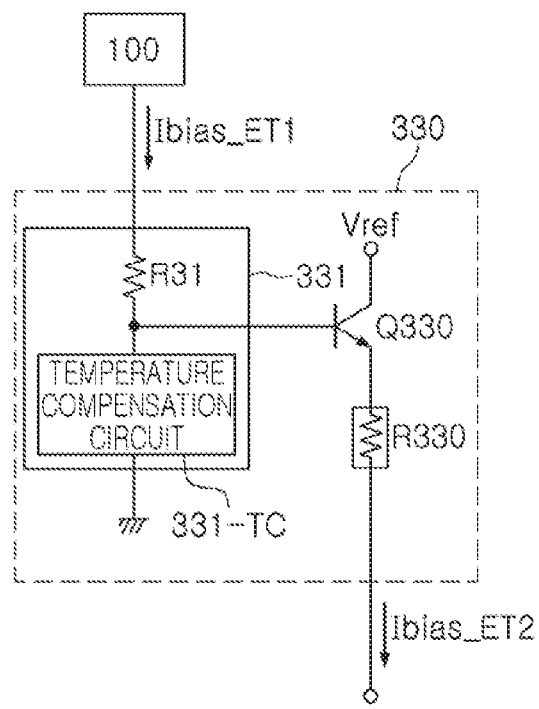
FIG. 14 is a view of a buffered bias circuit according to an embodiment.

FIG. 14 is a view of a buffered bias circuit according to an embodiment.

Referring to FIG. 14, the current bias circuit 331 includes a first bias resistor R31 and a temperature compensation circuit 331-TC.

The first bias resistor R31 is connected between the output terminal of the ET current bias circuit 100 and a base of the current amplifier 333.

The temperature compensation circuit 331-TC is connected between the base of the current amplifier 333 and the ground and has a resistance value, varied according to a temperature to perform temperature compensation.

In this case, a voltage applied to the temperature compensation circuit 331-TC is determined according to the resistance value of the first bias resistor R31 and the resistance value of the temperature compensation circuit 331-TC, and the bias current may be determined according to the determined voltage.

Figure 15:
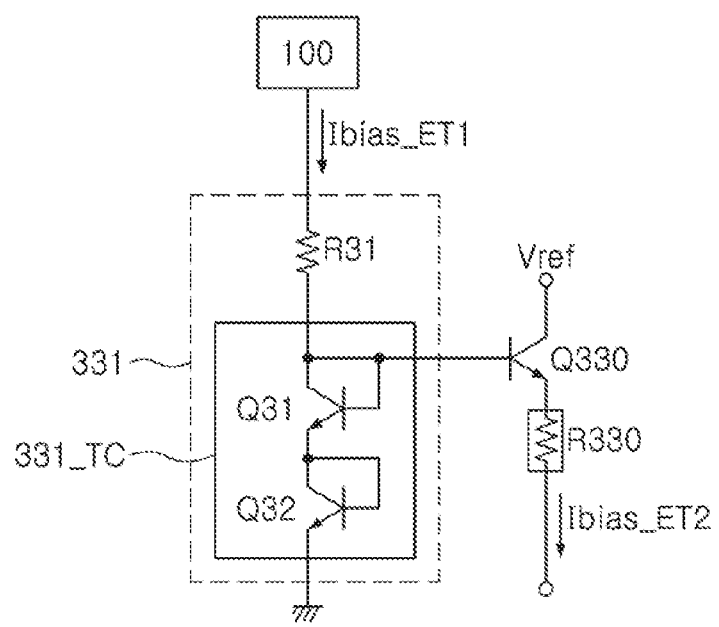
FIG. 15 is another view of a buffered bias circuit according to an embodiment.

FIG. 15 is another view of a buffered bias circuit according to an embodiment.

Referring to FIG. 15, the temperature compensation circuit 331-TC includes at least two diode-connected transistors Q31 and Q32, connected in series between the base of the current amplifier 333 and the ground. Here, since the diode-connected transistors Q31 and Q32 have resistance values according to the temperature, the diode-connected transistors Q31 and Q32 perform the temperature compensation.

Figure 16:
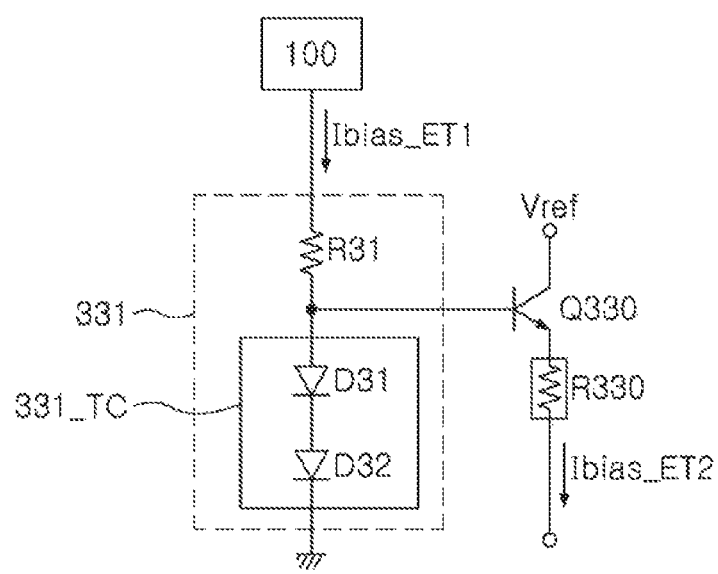
FIG. 16 is another view of a buffered bias circuit according to an embodiment.

FIG. 16 is another view of a buffered bias circuit according to an embodiment.

Referring to FIG. 16, the temperature compensation circuit 331-TC includes at least two diodes D31 and D32, connected in series between the base of the current amplifier 333 and the ground. Here, since the two diodes D31 and D32 have resistance values according to the temperature, the diodes D31 and D32 perform the temperature compensation.

The current amplifier 333 includes a resistor R330 for preventing thermal runaway in an output terminal outputting the second ET bias current Ibias_ET.

Figure 17:
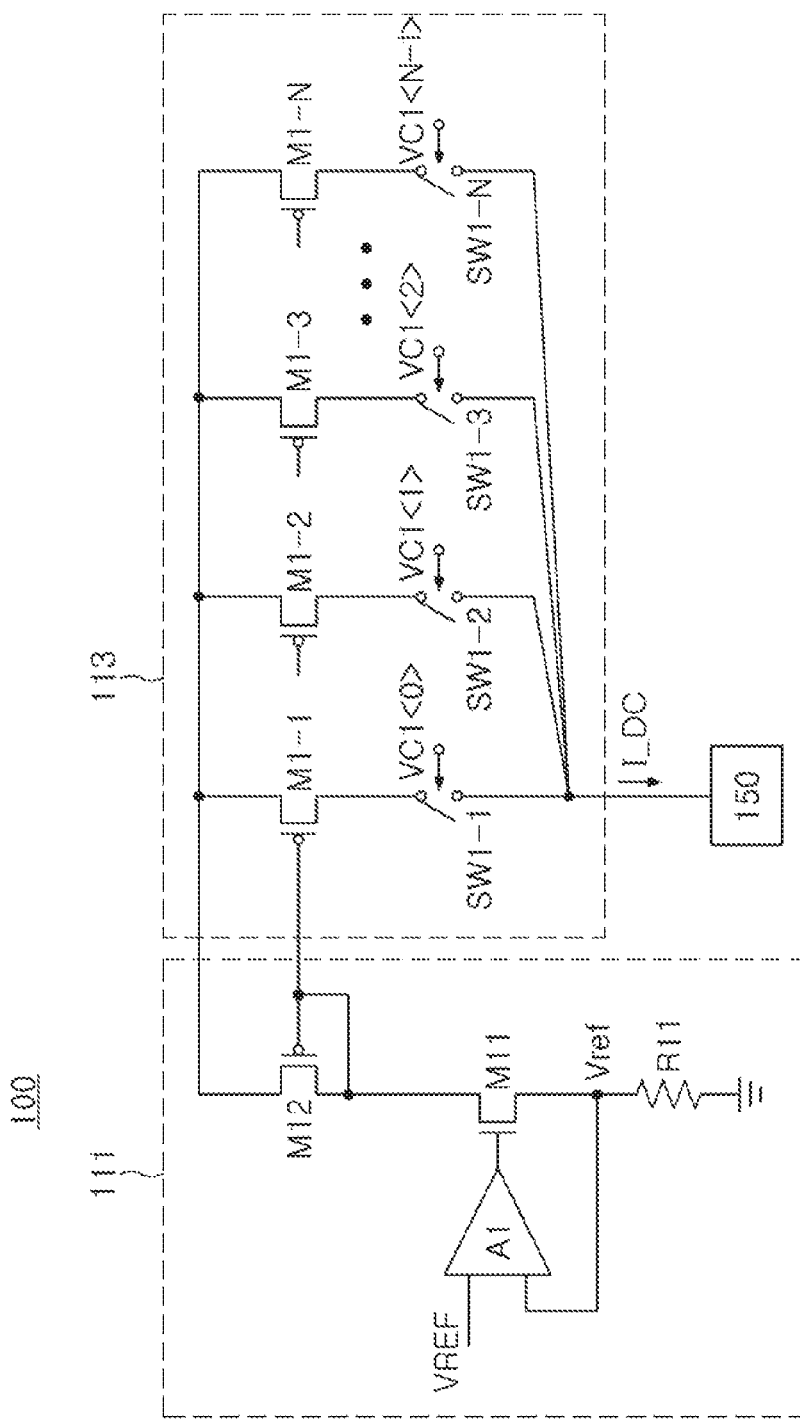
FIG. 17 is a view of a first current source circuit 110 according to an embodiment.

An example in which the first current source circuit 110 adjusts the direct current I_DC according to the first control signal VC1 is illustrated in FIG. 17, but the first current source circuit 110 is not limited thereto. For example, any suitable circuit may be used as long as it is able to adjust the direct current I_DC according to the first control signal VC1. In addition, an example in which the second current source circuit 130 adjusts the ET current I_ET according to the second control signal VC2 is illustrated in FIG. 18, but the second current source circuit 130 is not limited thereto. For example, any suitable circuit may be used as long as it is operable to adjust the ET current I_ET according to the second control signal VC2.

FIG. 17 is a view of a first current source circuit 110 according to an embodiment.

Referring to FIG. 17, the first current source circuit 110 includes a first current source 111 and a first current mirror circuit 113.

The first current source 111 includes a first operational amplifier A1, a first resistor R11, a first MOS transistor M11, and a second MOS transistor M12.

The first operational amplifier A1 includes a first input terminal, input with the reference voltage VREF, a second input terminal connected to the first resistor R11, and an output terminal connected to a gate of the first MOS transistor M11.

The first MOS transistor M11 adjusts an internal current according to an output voltage of the first operational amplifier A1, and the second MOS transistor M12 has a structure in which it is stacked on the first MOS transistor M11.

The reference voltage VREF is applied across the first resistor R11 by the first operational amplifier A1. Accordingly, the internal current is generated according to the reference voltage VREF and a resistance value of the first resistor R11 and flows through the second MOS transistor M12 and the first MOS transistor M11.

The first current mirror circuit 113 has gates, commonly connected in parallel to a base of the second MOS transistor M12, and includes a plurality of MOS transistors M1-1 to M1-N performing a current mirroring and a plurality of switch elements SW1-1 to SW1-N connected between the plurality of MOS transistors M1-1 to M1-N and the output terminal.

Here, each of the plurality of MOS transistors M1-1 to M1-N provides a current obtained by mirroring the internal current according to a ratio with a size of the second MOS transistor M12.

Each of the plurality of switch elements SW1-1 to SW1-N are operable to become an on-state or an off-state in response to a corresponding signal of the first control signal VC1, and when each of the plurality of switch elements SW1-1 to SW1-N is in the on-state, each of the plurality of switch elements SW1-1 to SW1-N select a current mirrored by each of the plurality of MOS transistors M1-1 to M1-N. Thereafter, the selected mirroring currents are summed to generate the direct current I_DC.

Accordingly, the direct current I_DC has a current value, determined according to the number of transistors, in the on-state in response to the first control signal VC1 among the plurality of MOS transistors M1-1 to M1-N.

Figure 18:
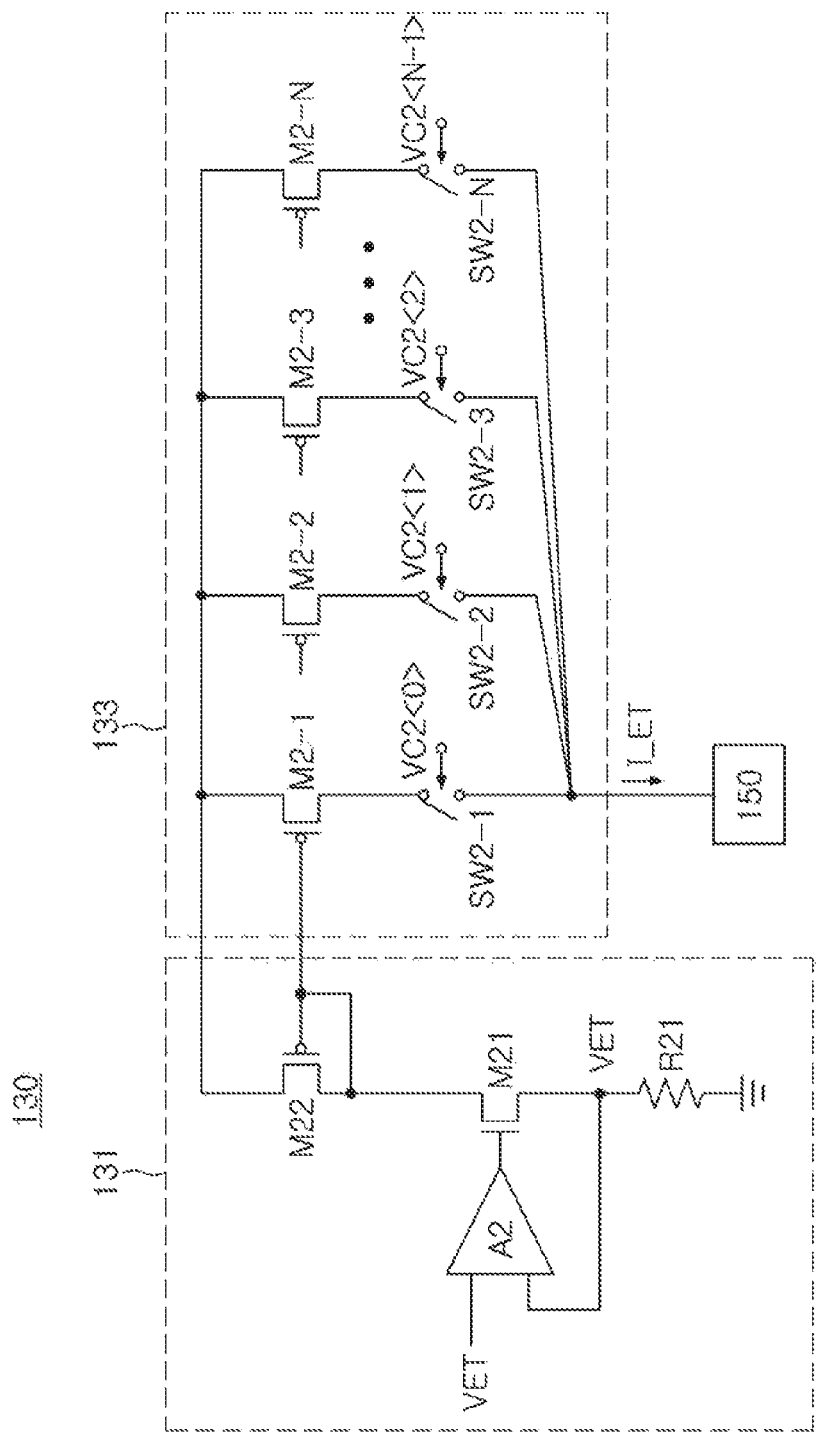
FIG. 18 is a view of a second current source circuit 130 according to an embodiment

FIG. 18 is a view of a second current source circuit 130 according to an embodiment.

Referring to FIG. 18, the second current source circuit 130 includes a second current source 131 and a second current mirror circuit 133.

The second current source 131 includes a second operational amplifier A2, a second resistor R21, a third MOS transistor M21, and a fourth MOS transistor M22.

The second operational amplifier A2 includes a first input terminal, input with the ET voltage VET, a second input terminal connected to the second resistor R21, and an output terminal connected to a gate of the third MOS transistor M21.

The third MOS transistor M21 adjusts an internal current according to an output voltage of the second operational amplifier A2, and the fourth MOS transistor M22 has a structure in which it is stacked on the third MOS transistor M21.

The ET voltage VET is applied across the second resistor R21 by the second operational amplifier A2. Accordingly, the internal current is generated according to the ET voltage VET and a resistance value of the second resistor R21 and flows through the fourth MOS transistor M22 and the third MOS transistor M21.

The second current mirror circuit 133 has gates, commonly connected in parallel to a base of the fourth MOS transistor M22, and includes a plurality of MOS transistors M2-1 to M2-N performing a current mirroring and a plurality of switch elements SW2-1 to SW2-N connected between the plurality of MOS transistors M2-1 to M2-N and the output terminal.

Here, each of the plurality of MOS transistors M2-1 to M2-N provide a current obtained by mirroring the internal current according to a ratio with a size of the fourth MOS transistor M22.

Each of the plurality of switch elements SW2-1 to SW2-N become an on-state or an off-state in response to a corresponding signal of the second control signal VC2, and when each of the plurality of switch elements SW2-1 to SW2-N is in the on-state, each of the plurality of switch elements SW2-1 to SW2-N select a current mirrored by each of the plurality of MOS transistors M2-1 to M2-N. Thereafter, the selected mirroring currents may be summed to generate the ET current I_ET.

Accordingly, the ET current I_ET has a current value, determined according to the number of transistors, in the on-state in response to the second control signal VC2 among the plurality of MOS transistors M2-1 to M2-N.

Figure 19:
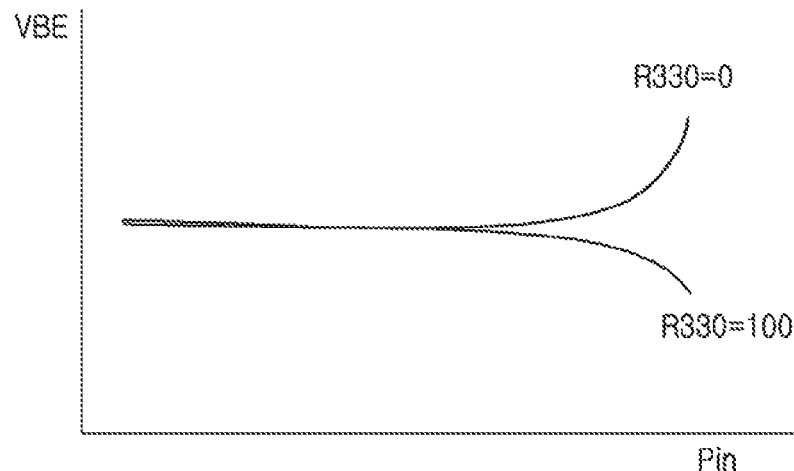
FIG. 19 is a view of a change in a base-emitter direct current voltage according to amplitude of an input signal according to an embodiment.
Figure 20:
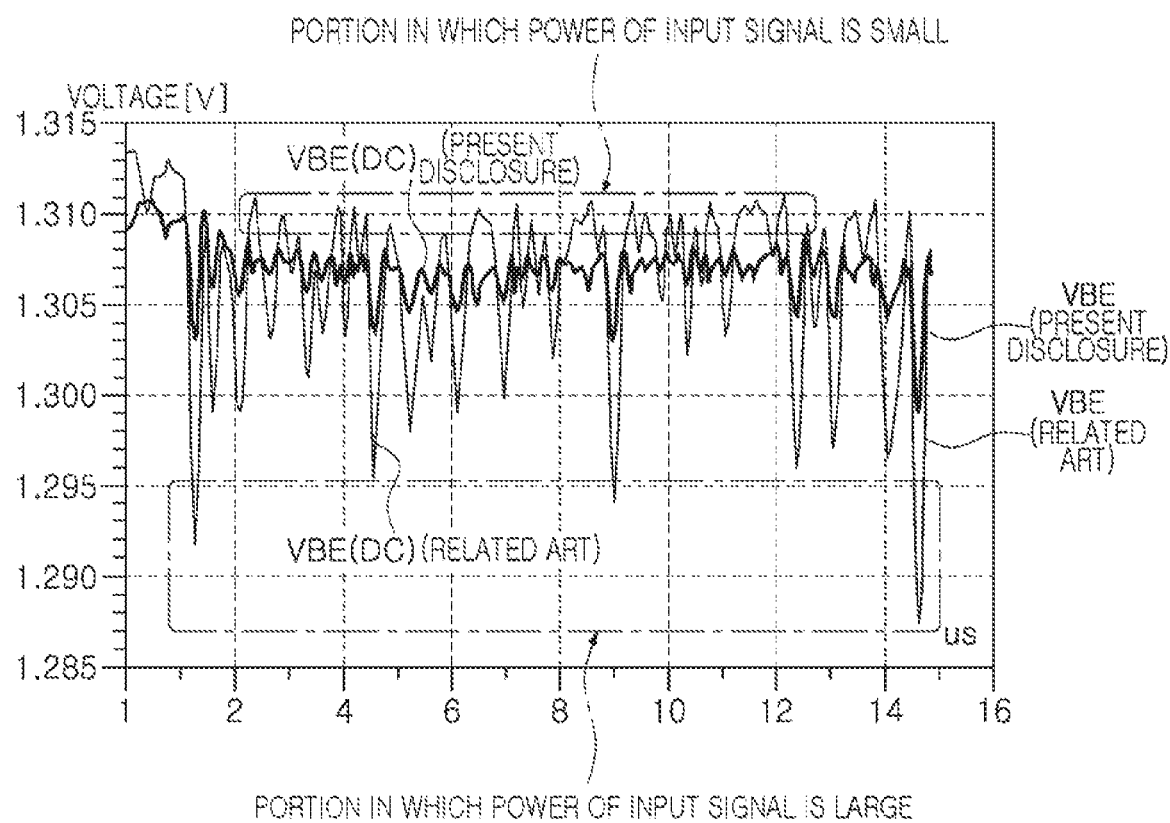
FIG. 20 is a view of a signal portion having high amplitude and a signal portion having low amplitude of an input signal according to an embodiment.

FIG. 19 is a view of a change in a base-emitter direct current voltage according to amplitude of an input signal according to an embodiment and FIG. 20 is a view of a signal portion having high amplitude and a signal portion having low amplitude of an input signal according to an embodiment.

Referring to FIGS. 13 and 19, as amplitude of the input signal is increased, a base voltage of the power amplifier 310 is increased by the second order distortion component by the bipolar junction transistor (BJT) Q330 included in the buffered bias circuit 330 of FIG. 13 by boosting.

In this case, in a case in which the ballast resistor R330 is added, a degree of DC boosting is varied according to the resistance value of the ballast resistor R330. For example, in a case in which the ballast resistor R330 is not present, as a pin is increased, the base voltage of the power amplifier 310 is increased. As an example, in a case in which the ballast resistor R330 has the resistance value of 100 ohms, as the amplitude of the input signal is increased, the base voltage value of the power amplifier 310 is decreased. In addition, in a case in which the ballast resistor R330 has the resistance value between 0 and 100 ohms, the base voltage value of the power amplifier 310 has a median value.

Referring to FIG. 20, the base voltage of an existing power amplifier includes a portion having high power and a portion having low power, and in a case in which the resistance value of the ballast resistor R330 is set to be high in conditions (for example, a frequency band and a power mode) in which the existing power amplifier operates, when power of the input signal is high, the base voltage is decreased. In this case, in a case in which the first ET bias current is supplied so that the ratio of the average current of the ET current I_ET and the direct current I_DC is appropriate, an amount of change of the base voltage may be reduced as illustrated in FIG. 20.

As an example, in a case in which the ballast resistor R330 is appropriately designed, the amount of change of the base voltage is also significantly reduced, but since the appropriate design of the ballast resistor R330 may not be satisfied in all operating conditions (all frequency bands and all power modes), the first ET bias current that meets each of the conditions may be required and it may be beneficial to adjust the ratio of the average current I_ET_Aver of the ET current I_ET and the direct current I_DC configuring the first ET bias current according to each of the conditions.

Accordingly, the ballast resistor R330 may be designed to have an appropriate value in about a middle band and the ratio of the average current of the ET current I_ET and the direct current I_DC of the first ET bias current may then be adjusted according to the operating conditions, such that the ballast resistor R330 and the ratio may be optimized for the corresponding power amplifier.

Figure 21:
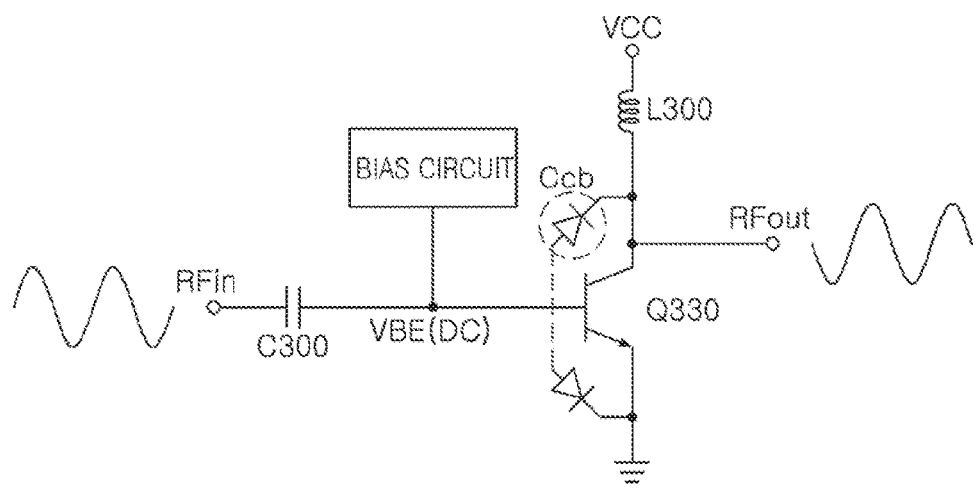
FIG. 21 is a view illustrating an amplitude modulation-phase modulation (AM-PM) distortion of the power amplifier apparatus.

FIG. 21 is a conceptual view illustrating an amplitude modulation-phase modulation (AM-PM) distortion of the power amplifier apparatus.

Referring to FIG. 21, a base-emitter direct current voltage VBE(DC) of the bipolar junction transistor (BJT) included in the power amplifier apparatus is changed according to a voltage level of the input signal, and accordingly, the collector-base capacitance Ccb by a PN junction diode between collector-base C-B of the bipolar junction transistor (BJT) is changed to cause a phase difference between the base-collector. As a result, AM-PM distortion may occur.

Here, since the amount of change of the collector-base capacitance Ccb of the bipolar junction transistor (BJT) is increased as the amount of change of the base-emitter DC voltage VBE(DC) of the bipolar junction transistor (BJT) is increased, AM-PM distortion refers to a distortion occurring according to the phase difference between the base-collector of the bipolar junction transistor (BJT) occurring according to the increased variation of the collector-base capacitance Ccb of the bipolar junction transistor (BJT).

Referring to FIGS. 20 and 21, in a case in which the bias current supplied to the base of the power amplifier circuit is a fixed value, AM-PM distortion as described above may occur, but according to an embodiment, the envelope tracking (ET) bias current is supplied to the base of the power amplifier circuit to prevent a variation in which the base-emitter DC voltage of the power amplifier circuit is decreased in a case of a portion in which the power of the input signal is large and to prevent a variation in which the base-emitter DC voltage of the power amplifier circuit is increased in a case of a portion in which the power of the input signal is small on the contrary to this, thereby reducing the variation of the base-emitter DC voltage of the power amplifier circuit even in a case of the variations of the input signal and the power voltage VCC. Accordingly, AM-PM distortion may be reduced and ACPR may be improved.

Figure 22:
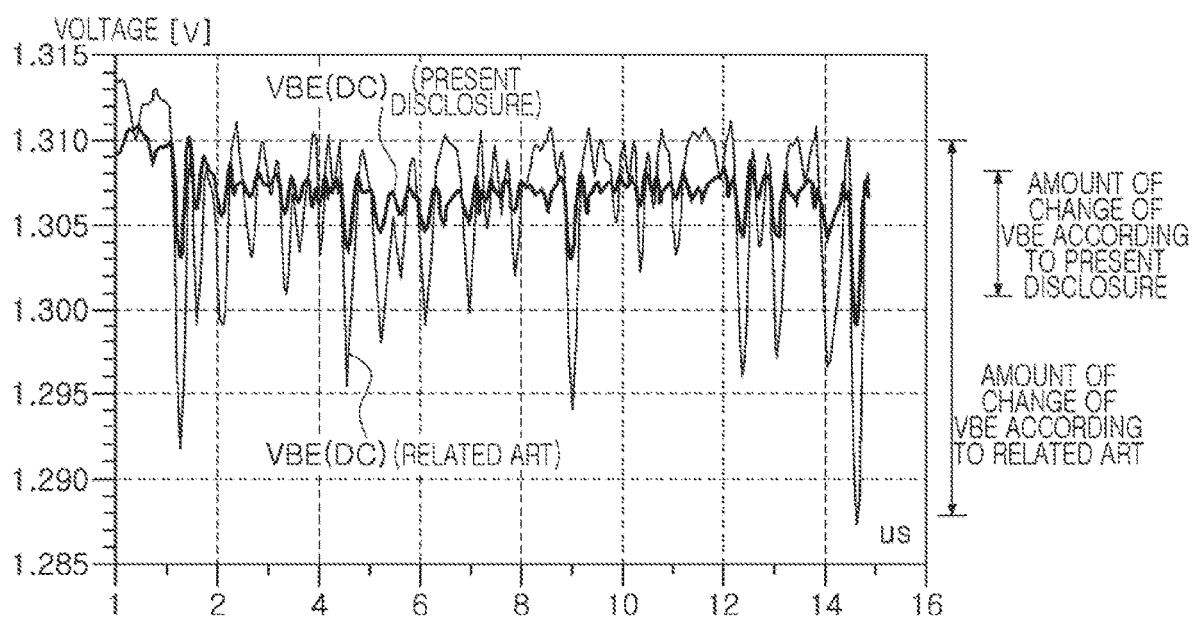
FIG. 22 is a view illustrating a change in a base-emitter direct current voltage according to a bias current according to an embodiment

FIG. 22 is a view illustrating a change in a base-emitter direct current voltage according to a bias current according to an embodiment.

FIG. 22 illustrates a base-emitter DC voltage VBE(DC) (the related art) by a fixed current bias Ibias-fixed and a base-emitter DC voltage VBE(DC) (the present disclosure) by the first ET bias current Ibias-ET1 over time (μs).

Referring to FIGS. 21 and 22, in a case in which a degree in which the VBE(DC) (the related art) is changed according to the amplitude of the input signal is large in FIG. 19, the amount of change of the capacitance Ccb (a parasitic junction capacitor, physically generated in the BJT) may also be large in FIG. 20. Such a change of the capacitance Ccb may cause a phase change according to the input signal, thereby increasing AM-PM distortion. On the contrary, it may be seen in FIG. 22 that the amount of change of the VBE(DC) according to the present disclosure is beneficially reduced as compared to the conventional structure. It may be seen that AM-PM distortion may be reduced by reducing the change of the capacitance Ccb.

As an example, in a case in which the ratio of the average current of the ET current I_ET and the direct current I_DC of the first ET bias current is higher than necessary, when the input signal is large, the VBE(DC) is also increased. Also in this case, the amount of change of the capacitance Ccb is increased, thereby increasing AM-PM distortion. Therefore, the VBE(DC) is applied at an appropriate ratio of the average current of the ET current I_ET and the direct current I_DC of the first ET bias current.

Accordingly, an amount of change of the base-emitter DC voltage VBE(DC) by the first ET bias current Ibias_ET1 (the present disclosure) is more reduced than an amount of change of the base-emitter DC voltage VBE(DC) (the related art) by the fixed current bias Ibias-fixed.

Figure 23:
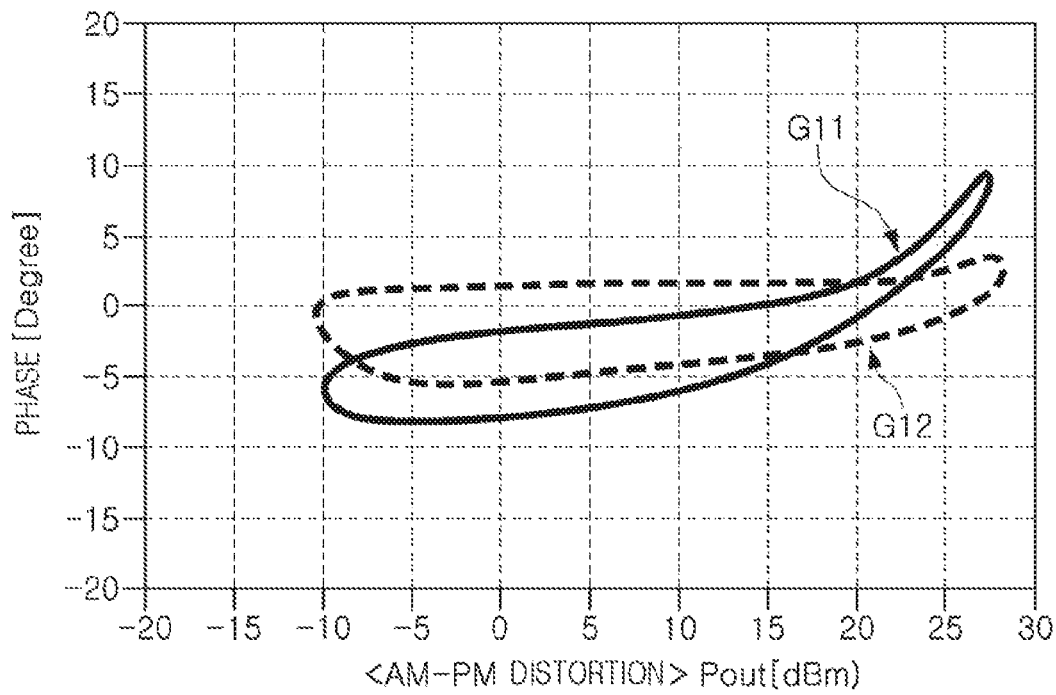
FIG. 23 is a view of an amplitude modulation-phase modulation (AM-PM) distortion simulation according to an embodiment.

FIG. 23 is a view of an amplitude modulation-phase modulation (AM-PM) distortion simulation according to an embodiment.

In FIG. 23, G11 is a graph illustrating AM-PM distortion by an existing fixed bias current and G12 is a graph illustrating AM-PM distortion by the ET bias current according to an embodiment. Here, a horizontal axis is output power, a vertical axis may be a phase change between an input and an output, and the smaller the phase change, the better.

Referring to G11 and G12 of FIG. 23, it may be seen that the phase change (−5 to +5) by the first ET bias current according to an embodiment is more reduced than the phase change (−10 to +10) by the existing fixed bias current.

Figure 24:
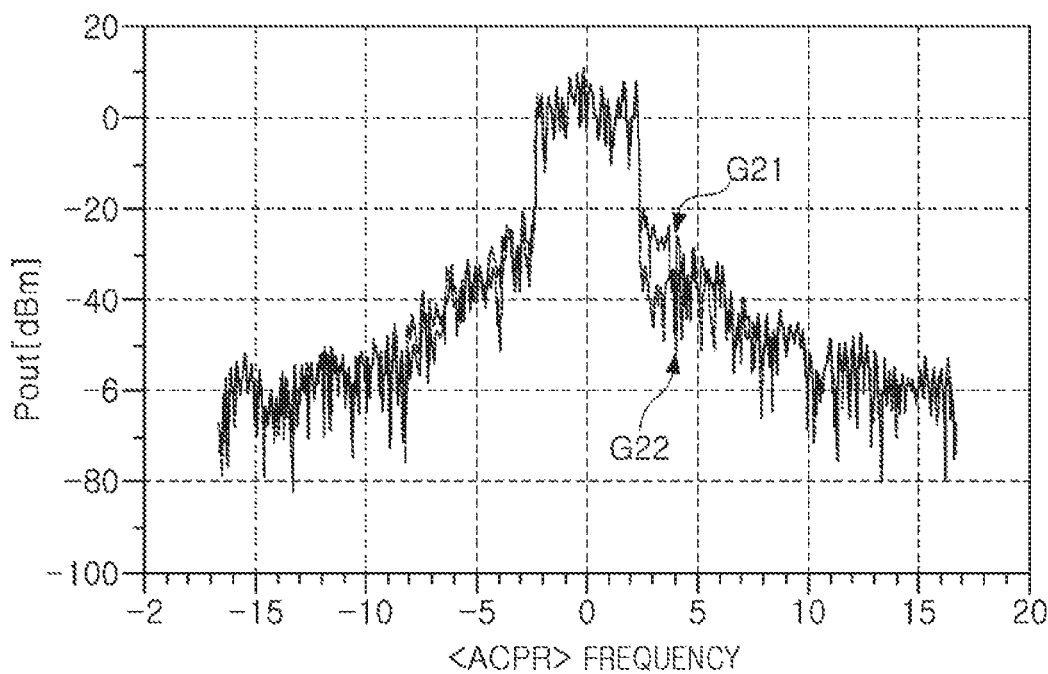
FIG. 24 is a graph illustrating a simulation result of an adjacent channel power ratio (ACPR) according to an embodiment.

FIG. 24 is a graph illustrating a simulation result of an adjacent channel power ratio (ACPR) (=self channel signal power/adjacent channel signal power) according to an embodiment.

In FIG. 24, G21 is a graph illustrating the ACPR by the existing fixed bias current and G22 is a graph illustrating the ACPR by the ET bias current according to an embodiment. Here, a horizontal axis is a frequency and a vertical axis is output power.

Referring to G21 and G22 of FIG. 24, it is confirmed that the ACPR by the ET bias current according to an embodiment improves an upper channel by about 7 dB and a lower channel by about 4 dB as compared to the ACPR by the existing fixed bias current.

FIGS. 25A through 25I are views illustrating of an amplitude modulation-phase modulation (AM-PM) distortion simulation according to the ratio of the ET current I_ET and the direct current I_DC according to an embodiment. Graphs of FIGS. 25A through 25I are views illustrating of an amplitude modulation-phase modulation (AM-PM) distortion simulation for a case in which the ballast resistor R330 has the resistance value of 100 ohms, a horizontal axis is an output power (Pout[dBm]), a vertical axis is a phase change between an input and an output, and the smaller the phase change, the better.

FIG. 25A is a graph illustrating AM-PM distortion for a case in which the ratio of the ET current I_ET and the direct current I_DC is 80% and 20%, FIG. 25B is a graph illustrating AM-PM distortion for a case in which the ratio of the ET current I_ET and the direct current I_DC is 70% and 30%, FIG. 25C is a graph illustrating AM-PM distortion for a case in which the ratio of the ET current I_ET and the direct current I_DC is 60% and 40%, FIG. 25D is a graph illustrating AM-PM distortion for a case in which the ratio of the ET current I_ET and the direct current I_DC is 50% and 50%, FIG. 25E is a graph illustrating AM-PM distortion for a case in which the ratio of the ET current I_ET and the direct current I_DC is 40% and 60%, FIG. 25F is a graph illustrating AM-PM distortion for a case in which the ratio of the ET current I_ET and the direct current I_DC is 30% and 70%, FIG. 25G is a graph illustrating AM-PM distortion for a case in which the ratio of the ET current I_ET and the direct current I_DC is 20% and 80%, FIG. 25H is a graph illustrating AM-PM distortion for a case in which the ratio of the ET current I_ET and the direct current I_DC is 10% and 90%, and FIG. 25I is a graph illustrating AM-PM distortion for a case in which the ratio of the ET current I_ET and the direct current I_DC is 0% and 100%. Here, a horizontal axis is output power and a vertical axis is a phase difference between an input and an output.

In FIGS. 25A through 25I, G11 is a graph illustrating AM-PM distortion by the existing fixed bias current and G12 is a graph illustrating AM-PM distortion by the ET bias current according to an embodiment.

Referring to G11 and G12 in FIGS. 25A through 25I, the closer the phase difference is to 0°, the better. Referring first to FIG. 25A, when the ET current of the first ET bias current of 0% is applied, the same AM-PM distortion result as the structure according to the related art may be obtained.

In a case in which the ratio becomes 90% by increasing a ratio of the ET current of the first ET bias current by 10% and decreasing a ratio of the direct current by 10% using the first and second control signals VC1 and VC2 of FIG. 1, it is seen that AM-PM distortion is slightly reduced from FIG. 25I to FIG. 25H.

In the same method, in a case in which the ratio of the ET current and the direct current is adjusted by adjusting the first control signal VC1 and the second control signal VC2 while constantly maintaining a total amount of average current, AM-PM distortion is changed from FIG. 25I to FIG. 25A.

It is confirmed that AM-PM distortion is significantly reduced at FIG. 25E or FIG. 25F of FIGS. 25A through 25I. That is, in the power amplifier illustrated in the embodiment, in a case in which the ratio of the ET current is about 30 to 40%, AM-PM distortion is significantly reduced.

According to the embodiment as described above, in the portion in which the power of the RF signal is high, the power voltage VCC may be increased and the base-emitter DC voltage may be inversely decreased. In this case, in order to prevent the occurrence of AM-PM distortion, the decrease of the base-emitter DC voltage is reduced by adjusting the ratio of the first ET bias current.

On the contrary, in the portion in which the power of the RF signal is low, the power voltage VCC is decreased and the base-emitter DC voltage is inversely increased. In this case, the increase of the base-emitter DC voltage is reduced by reducing the value of the ET bias current.

As a result, AM-PM distortion is reduced and the ACPR is improved by significantly reducing the variation of the base-emitter DC voltage according to the variation of the power voltage VCC.

As set forth above, according to the embodiments, the power amplifier apparatus is applied to the multiband communications system and controls the average current of the ET bias current based on the envelope of the input signal to be constant, whereby the power efficiency may be maintained at a more appropriate level.

Further, AM-PM distortion among the linear characteristics of the power amplifier apparatus are reduced to be adaptive to the corresponding band by adjusting the ratio of the average current of the ET current and the direct current that configure the ET bias current to be suitable for the corresponding band, whereby the ACPR may be improved.

That is, the ratio of the average current of the ET current and the direct current that configure the ET bias current are adjusted so that the variation of the base DC voltage of the bipolar junction transistor (BJT) is reduced according to the corresponding band in the power amplifier circuit of the multiband, whereby AM-PM distortion for the corresponding band is optimally reduced and the ACPR may be improved.

The control circuit 500 and bias current generator 150, ET current bias circuit 100, and ET circuit 200 in FIGS. 1, 3, and 7 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifier apparatus, comprising:
   an envelope tracking (ET) current bias circuit configured to generate a first ET bias current by calculating a DC (direct current) current, based on a reference voltage, and an ET current, based on an ET voltage, according to an envelope of an input signal; and
   a power amplifier circuit comprising a bipolar junction transistor that is configured to receive the first ET bias current through a base, receive a power voltage through a collector, and amplify the input signal received through the base,
   wherein an average current of the first ET bias current is controlled to be substantially constant,
   wherein a ratio of an average current of the ET current is 80% of or less than 80% of the first ET bias current.

2. The power amplifier apparatus of claim 1, wherein a ratio of an average current of the ET current and the DC current is predetermined.

3. The power amplifier apparatus of claim 2, further comprising a control circuit configured to generate a first control signal and a second control signal based on the ratio of an average current of the ET current and the DC current and provide the generated first and second control signals to the ET current bias circuit.

4. The power amplifier apparatus of claim 3, wherein the control circuit comprises the ratio of an average current of the ET current and the DC current, determined according to operating characteristics of the corresponding power amplifier circuit.

5. The power amplifier apparatus of claim 3, wherein the ET current bias circuit comprises:
   a first current source circuit configured to adjust a value of the DC current in response to the first control signal;
   a second current source circuit configured to adjust a value of the ET current in response to the second control signal; and
   a bias current generator configured to generate the first ET bias current by calculating the DC current and the ET current and supply the generated first ET bias current to a base of the bipolar junction transistor.

6. The power amplifier apparatus of claim 5, wherein the bias current generator is configured to generate the first ET bias current by connecting an output node of the first current source circuit to an output node of the second current source circuit and summing the DC current and the ET current.

7. The power amplifier apparatus of claim 2, wherein the power amplifier circuit comprises:
   a power amplifier comprising the bipolar junction transistor, and the power amplifier is configured to amplify the input signal through an input terminal; and
   a buffered bias circuit configured to generate a second ET bias current based on the first ET bias current, and supply the second ET bias current to a base of the bipolar junction transistor.

8. The power amplifier apparatus of claim 2, further comprising an ET circuit configured to generate the power voltage tracking the ET voltage and supply the generated power voltage to the power amplifier circuit,
   wherein the ET current bias circuit is configured to receive the power voltage from the ET circuit and generate the ET current.

9. The power amplifier apparatus of claim 2, further comprising an envelope detection circuit configured to detect the ET voltage,
    wherein the ET current bias circuit is configured to receive the ET voltage from the envelope detection circuit and generate the ET current.

10. The power amplifier apparatus of claim 2, further comprising:
    an envelope detection circuit configured to detect the ET voltage; and
    an average power tracking (APT) circuit configured to generate the power voltage tracking an average voltage of the ET voltage and supply the generated power voltage to the power amplifier circuit,
    wherein the ET current bias circuit configured to receive the ET voltage from the envelope detection circuit and generate the ET current.

11. The power amplifier apparatus of claim 7, wherein the buffered bias circuit includes:
    a current bias circuit connected between an output terminal of the ET current bias circuit and a ground;
    a current amplifier current-biased by the current bias circuit and configured to amplify the first ET bias current and generate the second ET bias current; and
    a ballast resistor connected to an output terminal that is configured to output the second ET bias current.

12. The power amplifier apparatus of claim 11, wherein the ballast resistor has a resistance value that is set according to the ratio of an average current of the ET current and the DC current.

13. The power amplifier apparatus of claim 11, wherein the current bias circuit comprises:
    a first bias resistor connected between the output terminal of the ET current bias circuit and a base of the current amplifier; and
    a temperature compensation circuit connected between the base of the current amplifier and the ground and having a resistance value that is varied according to a temperature.

14. The power amplifier apparatus of claim 13, wherein the temperature compensation circuit comprises at least two diode-connected transistors connected in series between the base of the current amplifier and the ground.

15. The power amplifier apparatus of claim 13, wherein the temperature compensation circuit comprises at least two diodes connected in series between the base of the current amplifier and the ground.

16. A power amplifier apparatus comprising:
    an envelope tracking (ET) current bias circuit configured to generate a first ET bias current by calculating a DC (direct current) current, based on a reference voltage, and an ET current, based on an ET voltage, according to an envelope of an input signal; and
    a power amplifier circuit comprising first to n-th power amplifier circuits, wherein each of the first to n-th power amplifier circuits has a bipolar junction transistor that is configured to, receive the first ET bias current through a base, receive a power voltage through a collector, and amplify the input signal received through the base,
    wherein an average current of the first ET bias current is controlled to be substantially constant,
    wherein a ratio of an average current of the ET current is 80% or less than 80% of the first ET bias current.

17. The power amplifier apparatus of claim 16, wherein a ratio of an average current of the ET current and the DC current is predetermined.

18. The power amplifier apparatus of claim 17, further comprising a control circuit configured to generate a first control signal and a second control signal based on the ratio of an average current of the ET current and the DC current and provide the generated first and second control signals to the ET current bias circuit.

19. The power amplifier apparatus of claim 18, wherein the control circuit comprises the ratio of an average current of the ET current and the DC current, determined according to operating characteristics of each of the first to n-th power amplifier circuits.

20. The power amplifier apparatus of claim 18, wherein the ET current bias circuit comprises:
    a first current source circuit configured to adjust a value of the DC current in response to the first control signal;
    a second current source circuit configured to adjust a value of the ET current in response to the second control signal; and
    a bias current generator configured to generate the first ET bias current by calculating the DC current and the ET current and supply the generated first ET bias current to a base of the bipolar junction transistor.

21. The power amplifier apparatus of claim 20, wherein the bias current generator is configured to generate the first ET bias current by connecting an output node of the first current source circuit to an output node of the second current source circuit and summing the DC current and the ET current.

22. The power amplifier apparatus of claim 17, wherein each of the first to n-th power amplifier circuits comprise:
    a power amplifier comprising the bipolar junction transistor, and the power amplifier is configured to amplify the input signal through an input terminal; and
    a buffered bias circuit configured to generate a second ET bias current based on the first ET bias current and supply the second ET bias current to a base of the bipolar junction transistor.

23. The power amplifier apparatus of claim 17, further comprising an ET circuit configured to generate the power voltage tracking the ET voltage and supply the generated power voltage to the power amplifier circuit,
    wherein the ET current bias circuit is configured to receive the power voltage from the ET circuit and generate the ET current.

24. The power amplifier apparatus of claim 17, further comprising an envelope detection circuit configured to detect the ET voltage,
    wherein the ET current bias circuit is configured to receive the ET voltage from the envelope detection circuit and generate the ET current.

25. The power amplifier apparatus of claim 17, further comprising:
    an envelope detection circuit configured to detect the ET voltage; and
    an average power tracking (APT) circuit configured to generate the power voltage tracking an average voltage of the ET voltage and supply the generated power voltage to the power amplifier circuit,
    the ET current bias circuit is configured to receive the ET voltage from the envelope detection circuit and generate the ET current.

26. The power amplifier apparatus of claim 22, wherein the buffered bias circuit includes:
    a current bias circuit connected between an output terminal of the ET current bias circuit and a ground;

a current amplifier current-biased by the current bias circuit and configured to amplify the first ET bias current and generate the second ET bias current; and a ballast resistor connected to an output terminal that is configured to output the second ET bias current.

27. The power amplifier apparatus of claim 26, wherein the ballast resistor has a resistance value that is set according to the ratio of an average current of the ET current and the DC current.

28. The power amplifier apparatus of claim 26, wherein the current bias circuit comprises:

a first bias resistor connected between the output terminal of the ET current bias circuit and a base of the current amplifier; and a temperature compensation circuit connected between the base of the current amplifier and the ground and having a resistance value that is varied according to a temperature.

29. The power amplifier apparatus of claim 28, wherein the temperature compensation circuit comprises at least two diode-connected transistors connected in series between the base of the current amplifier and the ground.

30. The power amplifier apparatus of claim 28, wherein the temperature compensation circuit comprises at least two diodes connected in series between the base of the current amplifier and the ground.

* * * * *